(12) United States Patent
Park et al.

(10) Patent No.: US 12,191,335 B2
(45) Date of Patent: Jan. 7, 2025

(54) IMAGE SENSOR AND METHOD OF MANUFACTURING THE SAME

(71) Applicant: SAMSUNG ELECTRONICS CO., LTD., Suwon-si (KR)

(72) Inventors: Sang-Su Park, Seoul (KR); Kwansik Kim, Seoul (KR); Changhwa Kim, Hwaseong-si (KR); Taemin Kim, Hwaseong-si (KR); Gyuhyun Lim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 528 days.

(21) Appl. No.: 17/522,142

(22) Filed: Nov. 9, 2021

(65) Prior Publication Data

US 2022/0238571 A1 Jul. 28, 2022

(30) Foreign Application Priority Data

Jan. 22, 2021 (KR) .................. 10-2021-0009640

(51) Int. Cl.
*H01L 27/146* (2006.01)

(52) U.S. Cl.
CPC .... *H01L 27/1463* (2013.01); *H01L 27/14621* (2013.01); *H01L 27/14627* (2013.01); *H01L 27/14636* (2013.01); *H01L 27/14685* (2013.01)

(58) Field of Classification Search
CPC .......... H01L 27/1463; H01L 27/14621; H01L 27/14627; H01L 27/14636; H01L 27/14685; H01L 27/14605; H01L 27/14618; H01L 27/14634; H01L 27/14603

See application file for complete search history.

(56) References Cited

U.S. PATENT DOCUMENTS

| 8,674,283 | B2 | 3/2014 | Roy et al. |
| 8,962,444 | B2 | 2/2015 | Kim et al. |
| 9,607,841 | B2 | 3/2017 | Kim et al. |
| 10,032,819 | B2* | 7/2018 | Lee ............... H01L 27/1463 |
| 10,304,886 | B2 | 5/2019 | Chiang et al. |
| 10,504,953 | B2 | 12/2019 | Yanagita et al. |
| 10,529,767 | B2 | 1/2020 | Sato et al. |
| 10,797,095 | B2 | 10/2020 | Lee et al. |
| 10,840,285 | B2* | 11/2020 | Kim ............... H01L 27/14641 |

(Continued)

*Primary Examiner* — Kyoung Lee
*Assistant Examiner* — Sophia W Kao
(74) *Attorney, Agent, or Firm* — Sughrue Mion, PLLC

(57) ABSTRACT

An image sensor includes a substrate including a first surface and a second surface which is opposite to the first portion, and a pixel isolation portion provided in the substrate and configured to isolate unit pixels from each other. The pixel isolation portion includes a first filling insulation pattern extending from the first surface toward the second surface and having an air gap region, the first filling insulation pattern including a first sidewall and a second sidewall which is opposite to the first sidewall, a conductive structure including a first portion on the first sidewall, a second portion on the second sidewall, and a connection portion connecting the first portion and the second portion, and an insulating liner provided between the first portion and the substrate and between the second portion and the substrate.

19 Claims, 36 Drawing Sheets

(56) References Cited

U.S. PATENT DOCUMENTS

| | | | |
|---|---|---|---|
| 2014/0054662 A1* | 2/2014 | Yanagita | H01L 27/14645 438/73 |
| 2014/0183606 A1 | 7/2014 | Kakehi et al. | |
| 2015/0372031 A1* | 12/2015 | Yoon | H01L 27/1463 257/446 |
| 2017/0365631 A1 | 12/2017 | Iizuka et al. | |
| 2020/0227452 A1 | 7/2020 | Ishii et al. | |
| 2022/0149101 A1* | 5/2022 | Lee | H01L 27/1464 |
| 2022/0173143 A1* | 6/2022 | Kim | H01L 27/14614 |

* cited by examiner

IMAGE SENSOR AND METHOD OF MANUFACTURING THE SAME

CROSS-REFERENCE TO RELATED APPLICATION

This application is based on and claims priority under 35 U.S.C. § 119 to Korean Patent Application No. 10-2021-0009640, filed on Jan. 22, 2021, in the Korean Intellectual Property Office, the disclosure of which is hereby incorporated by reference in its entirety.

BACKGROUND

Embodiments of the disclosure relate to an image sensor and a method of manufacturing the same.

Image sensors are semiconductor devices for converting optical images into electrical signals. Image sensors may be categorized as any one of charge coupled device (CCD) image sensors and complementary metal-oxide-semiconductor (CMOS) image sensors. A CIS (CMOS image sensor) may include a plurality of pixels two-dimensionally arranged. Each of the pixels may include a photodiode (PD). The photodiode may convert incident light into an electrical signal.

SUMMARY

Embodiments of the disclosure may provide an image sensor capable of improving photosensitivity and capable of reducing or minimizing a dark current.

Embodiments of the disclosure may also provide a method of manufacturing an image sensor, which is capable of improving a yield.

According to an aspect of an example embodiment, an image sensor may include a substrate including a first surface and a second surface which is opposite to the first surface; and a pixel isolation portion provided in the substrate, the pixel isolation portion being configured to isolate unit pixels from each other. The pixel isolation portion may include a first filling insulation pattern extending from the first surface toward the second surface and having an air gap region, the first filling insulation pattern including a first sidewall and a second sidewall which are opposite to each other; a conductive structure including a first portion on the first sidewall, a second portion on the second sidewall, and a connection portion connecting the first portion and the second portion; and an insulating liner provided between the first portion and the substrate and provided between the second portion and the substrate.

According to an aspect of an example embodiment, an image sensor may include a substrate including unit pixels and including a first surface and a second surface which is opposite to the first surface; a pixel isolation portion provided in the substrate to isolate the unit pixels from each other; photoelectric conversion portions provided in the substrate, corresponding to the unit pixels, respectively; a transfer gate provided on the first surface, corresponding to each unit pixel of the unit pixels; a fixed charge layer contacting the second surface; a color filter array provided on the fixed charge layer; and a micro lens array layer on the color filter array. The pixel isolation portion may include a first filling insulation pattern extending from the first surface toward the second surface and having an air gap region, the first filling insulation pattern including a first sidewall and a second sidewall which are opposite to each other; and a conductive structure comprising a first portion on the first sidewall and a second portion on the second sidewall. A portion of the fixed charge layer may protrude toward the air gap region.

According to an aspect of an example embodiment, an image sensor may include a substrate including a first surface and a second surface which are opposite to each other; and a pixel isolation portion provided in the substrate, the pixel isolation portion being configured to isolate a first unit pixel from a second unit pixel. The pixel isolation portion may include a first filling insulation pattern extending from the first surface toward the second surface and having an air gap region, the first filling insulation pattern including a first sidewall and a second sidewall which are opposite to each other; a conductive structure including a first portion on the first sidewall, a second portion on the second sidewall, and a connection portion connecting the first portion and the second portion; and an insulating liner provided between the first portion and the substrate and provided between the second portion and the substrate. A density of an insulating material included in the insulating liner may be greater than a density of an insulating material included in the first filling insulation pattern.

According to an aspect of an example embodiment, a method of manufacturing an image sensor may include etching a substrate from a first surface of the substrate toward a second surface of the substrate to form a deep trench, the deep trench being configured to isolate unit pixels from each other; sequentially and conformally forming an insulating liner and a first conductive layer on the first surface to cover an inner sidewall and a bottom surface of the deep trench; forming a first filling insulation pattern including an air gap region in the deep trench; forming a connection conductive pattern on the first filling insulation pattern; and removing a portion of the first conductive layer on the first surface to form a first conductive pattern and a second conductive pattern, which are in contact with the connection conductive pattern.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Hereinafter, example embodiments of the disclosure will be described in more detail with reference to the accompanying drawings.

Figure 1:
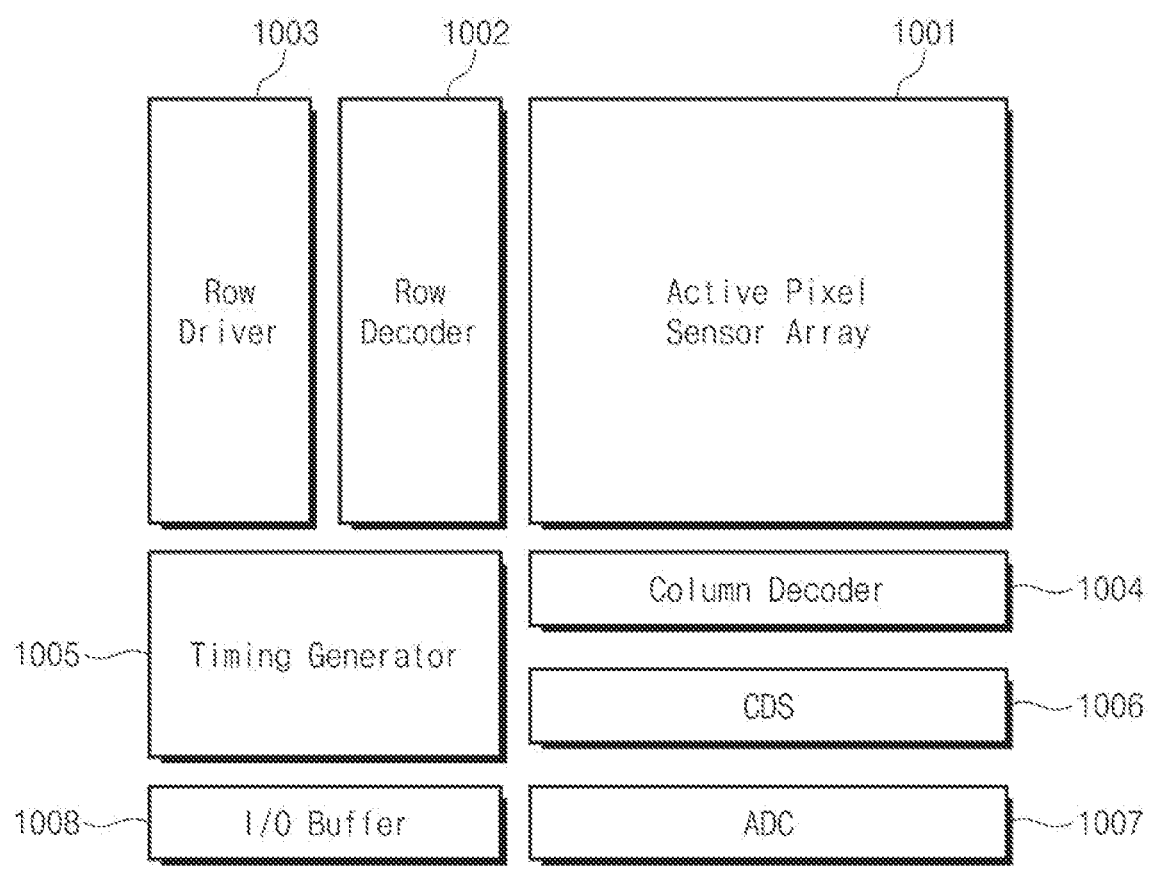
FIG. 1 is a schematic block diagram illustrating an image sensor according to some example embodiments of the disclosure.

FIG. 1 is a schematic block diagram illustrating an image sensor according to some example embodiments of the disclosure.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of unit pixels two-dimensionally arranged and may convert optical signals into electrical signals. The active pixel sensor array 1001 may be driven by a plurality of driving signals (e.g., a pixel selection signal, a reset signal, and a charge transfer signal) provided from the row driver 1003. In addition, the converted electrical signals may be provided to the correlated double sampler 1006.

The row driver 1003 may provide a plurality of driving signals for driving a plurality of the unit pixels to the active pixel sensor array 1001 based on signals decoded in the row decoder 1002. When the unit pixels are arranged in a matrix form, the driving signals may be provided in the unit of row of the matrix.

The timing generator 1005 may provide timing signals and control signals to the row decoder 1002 and the column decoder 1004.

The correlated double sampler 1006 may receive electrical signals generated from the active pixel sensor array 1001 and may hold and sample the received electrical signals. The correlated double sampler 1006 may doubly sample a specific noise level and a signal level of the electrical signal to output a difference level corresponding to a difference between the noise level and the signal level.

The analog-to-digital converter 1007 may convert an analog signal, which corresponds to the difference level outputted from the correlated double sampler 1006, into a digital signal and may output the digital signal.

The I/O buffer 1008 may latch the digital signals and may sequentially output the latched digital signals to an image signal processing unit (not shown) based on signals decoded in the column decoder 1004.

Figure 2:
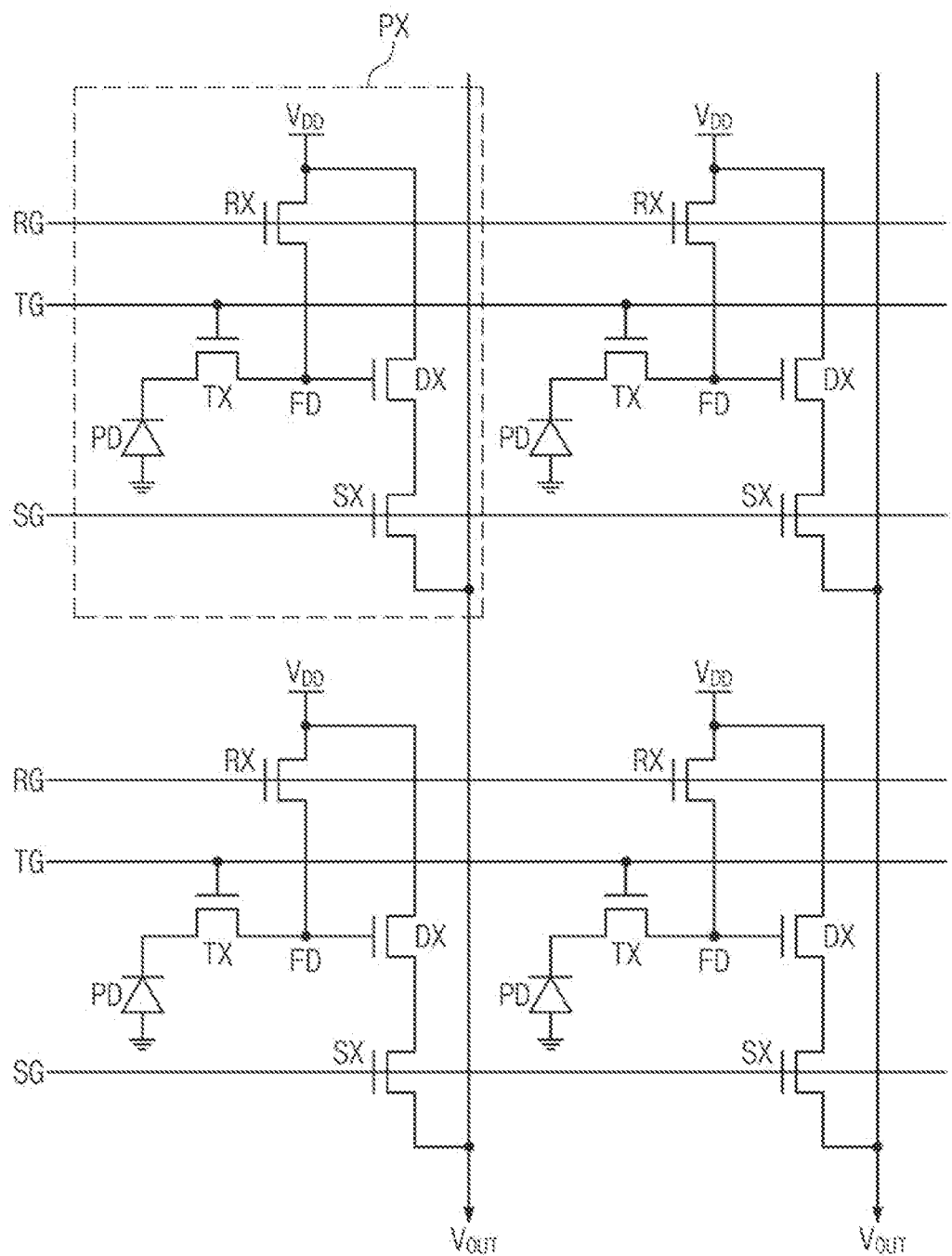
FIG. 2 is a circuit diagram illustrating an active pixel sensor array of an image sensor according to some example embodiments of the disclosure.

FIG. 2 is a circuit diagram illustrating an active pixel sensor array of an image sensor according to some example embodiments of the disclosure.

Referring to FIGS. 1 and 2, the active pixel sensor array 1001 may include a plurality of unit pixel regions PX, and the plurality of unit pixel regions PX may be arranged in a matrix form. Each of the unit pixel regions PX may include a transfer transistor TX and logic transistors RX, SX and DX. The logic transistors may include a reset transistor RX, a selection transistor SX, and a source follower transistor DX. The transfer transistor TX may include a transfer gate TG. Each of the unit pixel regions PX may further include a photoelectric conversion element PD and a floating diffusion region FD.

The photoelectric conversion element PD may generate photocharges (or charges) in proportion to the amount of light incident from the outside and may accumulate the generated photocharges. The photoelectric conversion element PD may include a photodiode, a photo transistor, a photo gate, a pinned photodiode, or a combination thereof. The transfer transistor TX may transfer charges generated in the photoelectric conversion element PD to the floating diffusion region FD. The floating diffusion region FD may receive the charges generated in the photoelectric conversion element PD and may cumulatively store the received charges. The source follower transistor DX may be controlled according to the amount of the photocharges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power voltage VDD. When the reset transistor RX is turned on, the power voltage VDD connected to the source electrode of the reset transistor RX may be applied to the floating diffusion region FD. Thus, when the reset transistor RX is turned on, the charges accumulated in the floating diffusion region FD may be discharged to reset the floating diffusion region FD.

The source follower transistor DX may function as a source follower buffer amplifier. The source follower transistor DX may amplify a potential change in the floating diffusion region FD and may output the amplified potential change to an output line VOUT.

The selection transistor SX may select the unit pixel regions PX to be sensed in the unit of row. When the selection transistor SX is turned on, the power voltage VDD may be applied to a drain electrode of the source follower transistor DX.

Figure 3:
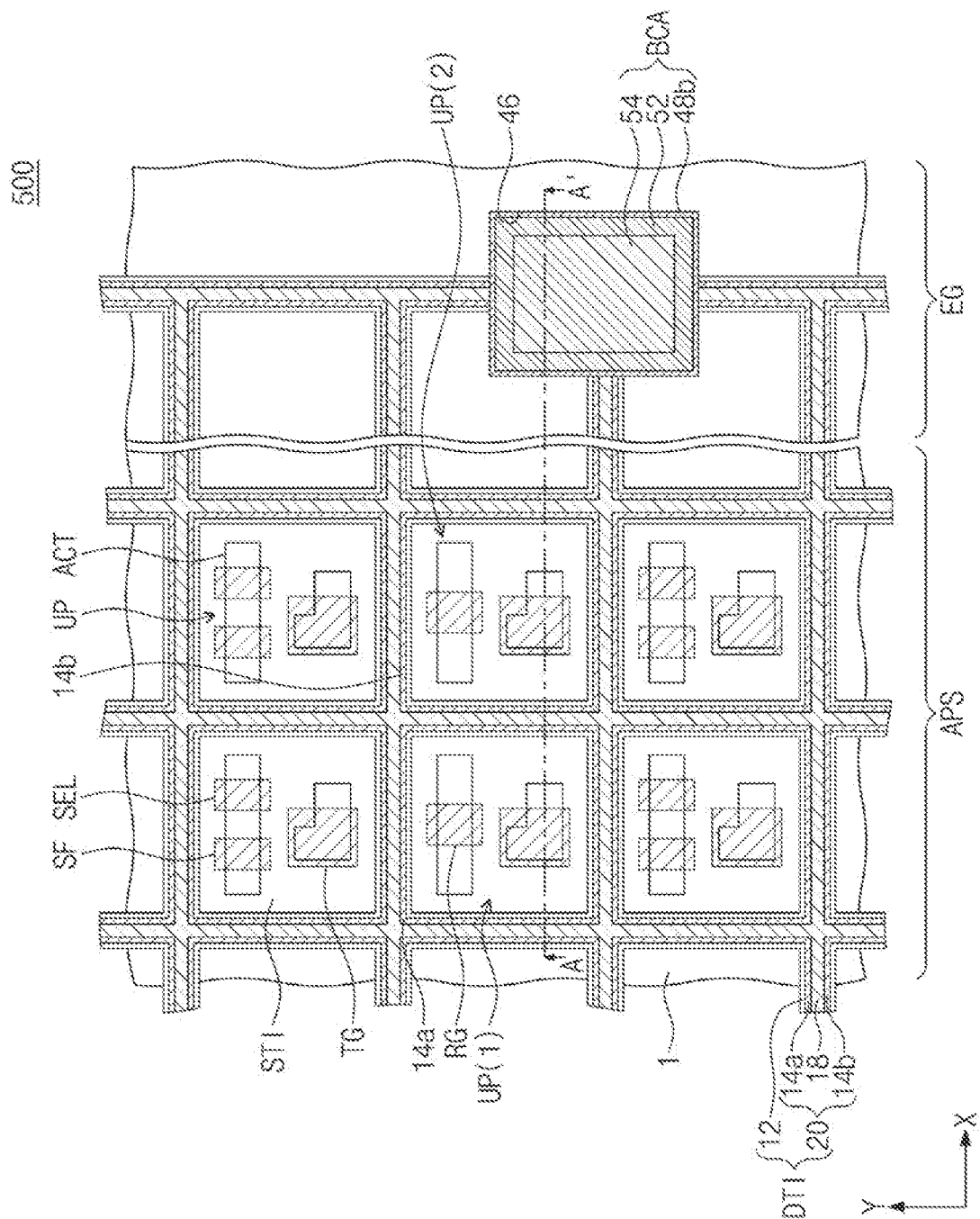
FIG. 3 is a plan view illustrating an image sensor according to some example embodiments of the disclosure.
Figure 4:
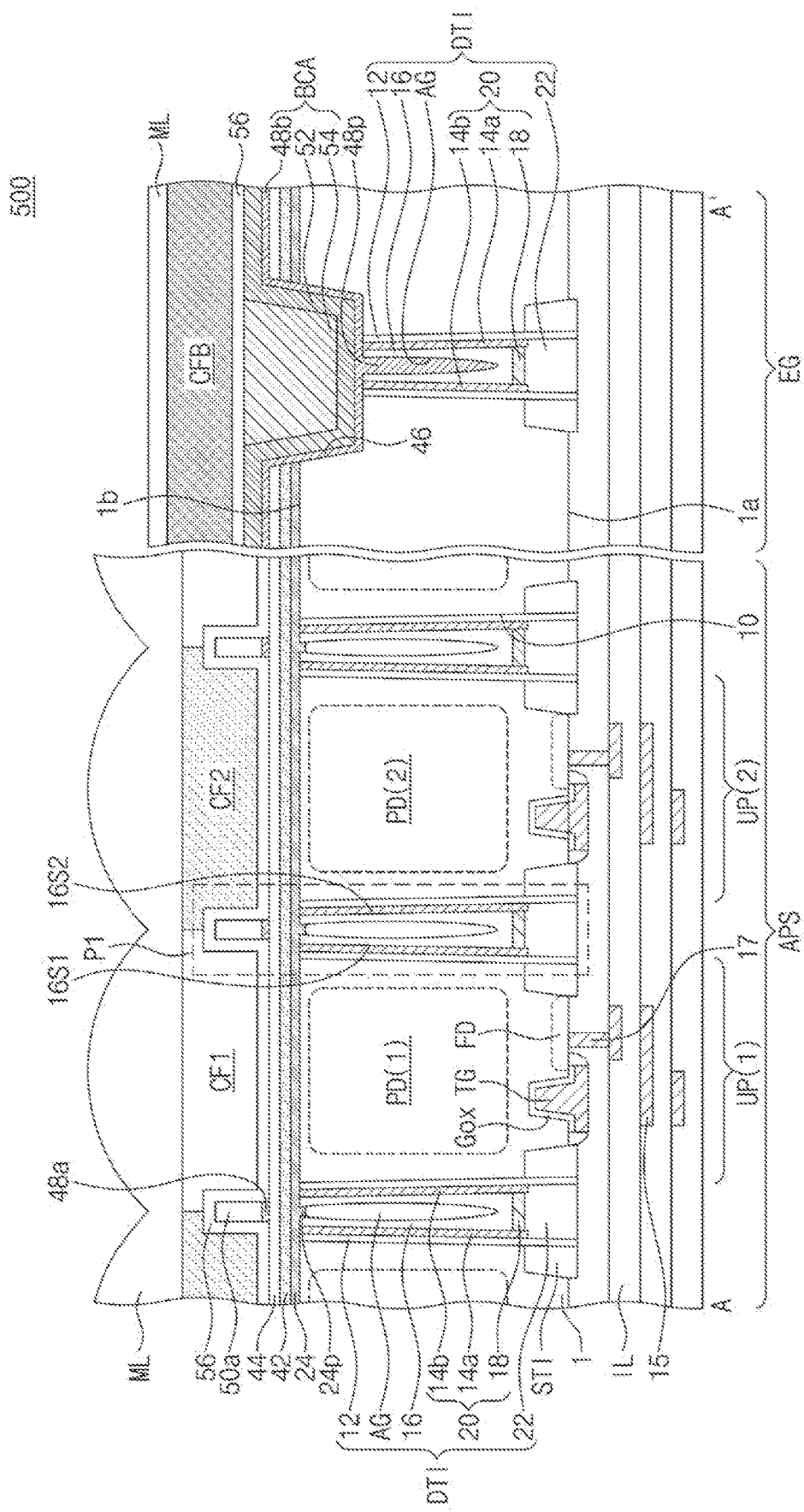
FIG. 4 is a cross-sectional view taken along a line A-A' of FIG. 3 according to some embodiments of the disclosure.

FIG. 3 is a plan view illustrating an image sensor according to some example embodiments of the disclosure. FIG. 4 is a cross-sectional view taken along a line A-A' of FIG. 3 according to some embodiments of the disclosure. FIGS. 5A to 5D are enlarged views of a portion 'P1' of FIG. 4 according to some example embodiments of the disclosure.

Referring to FIGS. 3 and 4, an image sensor 500 according to some embodiments of the disclosure may include a first substrate 1. For example, the first substrate 1 may be a single-crystalline silicon wafer, a silicon epitaxial layer, or a silicon-on-insulator (SOI) substrate. For example, the first substrate 1 may be doped with dopants of a first conductivity type. For example, the first conductivity type may be a P-type. The first substrate 1 may include a first surface 1a and a second surface 1b which are opposite to each other. The first substrate 1 may include a pixel array region APS and an edge region EG. The pixel array region APS may include a plurality of unit pixels UP. The edge region EG may correspond to a portion of a connection region CNR of FIGS. 15 and 17, which will be described later.

A pixel isolation portion DTI may be disposed in the first substrate 1 to isolate and/or define the unit pixels UP in the pixel array region APS. The pixel isolation portion DTI may extend into the edge region EG. The pixel isolation portion DTI may have a mesh shape when viewed in a plan view.

A photoelectric conversion portion PD may be disposed in the first substrate 1 of each of the unit pixels UP. The photoelectric conversion portions PD may be doped with dopants of a second conductivity type opposite to the first conductivity type. The second conductivity type may be, for example, an N-type. The N-type dopants included in the photoelectric conversion portion PD may form a PN junction with the P-type dopants included in the first substrate 1 around the photoelectric conversion portion PD, and thus a photodiode may be provided.

A shallow device isolation portion STI adjacent to the first surface 1a may be disposed in the first substrate 1. The pixel isolation portion DTI may penetrate the shallow device isolation portion STI. The shallow device isolation portion STI may define active regions ACT adjacent to the first surface 1a in each of the unit pixels UP. The active regions ACT may be provided for the transistors TX, RX, DX and SX of FIG. 2.

A transfer gate TG may be disposed on the first surface 1a of the first substrate 1 of each of the unit pixels UP. A portion of the transfer gate TG may extend into the first substrate 1. The transfer gate TG may be a vertical type gate. Alternatively, the transfer gate TG may not extend into the first substrate 1 but may be a planar type gate having a flat shape. A gate insulating layer Gox may be disposed between the transfer gate TG and the first substrate 1. A floating diffusion region FD may be disposed in the first substrate 1 at a side of the transfer gate TG. For example, the floating diffusion region FD may be doped with dopants of the second conductivity type.

The image sensor 500 may be a backside illuminated image sensor. Light may be incident into the first substrate 1 through the second surface 1b of the first substrate 1. Electron-hole pairs (EHPs) may be generated in a depletion region of the PN junction by the incident light. The generated electrons may move into the photoelectric conversion portion PD. When a voltage is applied to the transfer gate TG, the electrons may be moved into the floating diffusion region FD.

In one unit pixel UP, a reset gate RG may be disposed on the first surface 1a and may be adjacent to the transfer gate TG. In another unit pixel UP, a source follower gate SF and a selection gate SEL may be disposed on the first surface 1a and may be adjacent to the transfer gate TG. The gates TG, RG, SF and SEL may correspond to gates of the transistors TX, RX, DX and SX of FIG. 2, respectively. The gates TG, RG, SF and SEL may overlap the active regions ACT.

The first surface 1a may be covered with first interlayer insulating layers IL. Each of the first interlayer insulating layers IL may include at least one of a silicon oxide layer, a silicon nitride layer, a silicon oxynitride layer, or a porous low-k dielectric layer. First interconnection lines 15 may be disposed between or in the first interlayer insulating layers IL. The floating diffusion regions FD may be connected to the first interconnection lines 15 through first contact plugs 17. The first contact plugs 17 may penetrate a first interlayer insulating layer IL, closest to the first surface 1a, of the first interlayer insulating layers IL in the pixel array region APS.

Figure 5A:
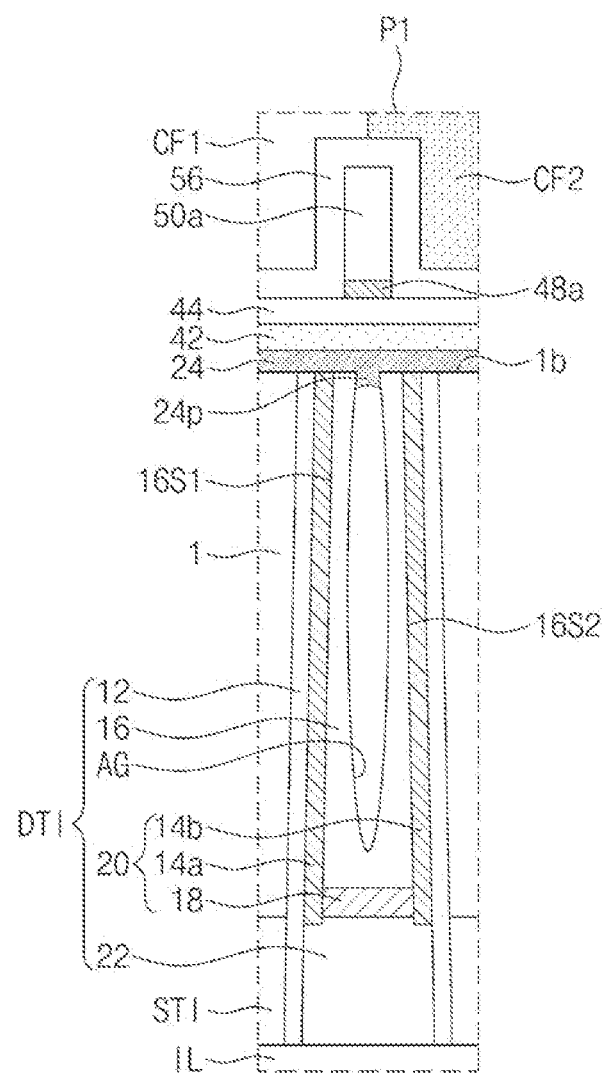
FIGS. 5A, 5B, 5C, and 5D are enlarged views of a portion 'P1' of FIG. 4 according to some example embodiments of the disclosure.

Referring to FIGS. 4 and 5A, the pixel isolation portion DTI may be disposed in a deep trench 10 which is formed to extend from the first surface 1a to the second surface 1b in the first substrate 1. A width of the deep trench 10 may progressively decrease from the first surface 1a toward the second surface 1b. The pixel isolation portion DTI may include a first filling insulation pattern 16, a conductive structure 20, an insulating liner 12, a second filling insulation pattern 22, and an air gap region AG. The first filling insulation pattern 16 may extend from the first surface 1a to the second surface 1b and may have the air gap region AG therein. The first filling insulation pattern 16 may include a first sidewall 16S1 and a second sidewall 16S2 which are opposite to each other. Although not shown in the drawings, the first filling insulation pattern 16 and the air gap region AG may have mesh shapes overlapping the pixel isolation portion DTI when viewed in a plan view.

The conductive structure 20 may include a first conductive pattern 14a on the first sidewall 16S1, a second conductive pattern 14b on the second sidewall 16S2, and a connection conductive pattern 18 connecting the first conductive pattern 14a and the second conductive pattern 14b. In some embodiments, the connection conductive pattern 18 may be in contact with a bottom surface of the first filling insulation pattern 16.

The first conductive pattern 14a may be referred to as a first conductive portion 14a, the second conductive pattern 14b may be referred to as a second conductive portion 14b, and the connection conductive pattern 18 may be referred to as a connection conductive portion 18. The first and second conductive patterns 14a and 14b may be spaced apart from each other. Each of the first and second conductive patterns 14a and 14b may have a ring shape surrounding a unit pixel UP adjacent thereto when viewed in a plan view. For example, in the plan view of FIG. 3, the first conductive pattern 14a may surround a first unit pixel UP(1), and the second conductive pattern 14b may surround a second unit pixel UP(2). The connection conductive pattern 18 may have a mesh shape in the plan view of FIG. 3.

The first conductive pattern 14a and the second conductive pattern 14b may include the same material. The first conductive pattern 14a and the second conductive pattern 14b may be formed at the same time and may include poly-silicon doped with the same dopants at the same concentration. For example, the dopants may be boron, phosphorus, or arsenic. In particular, the dopants may be boron. The connection conductive pattern 18 may include the same material as or a different material from that of the first and second conductive patterns 14a and 14b. For example, the connection conductive pattern 18 may include poly-silicon doped with dopants, or a metal. When the connection conductive pattern 18 includes poly-silicon doped with the dopants of which a kind is different from or the same as that of the first and second conductive patterns 14a and 14b, a dopant concentration of the connection conductive pattern 18 may be different from that of the first and second conductive patterns 14a and 14b. For example, each of the first and second conductive patterns 14a and 14b may have a thickness of 100 Å to 300 Å. If the thickness is less than 100 Å, the first and second conductive patterns 14a and 14b may be insufficient to function as a common bias line. If the thickness is greater than 300 Å, a modulation transfer function (MTF) characteristic may be deteriorated.

A negative bias voltage may be applied to the first conductive pattern 14a and the second conductive pattern 14b through the connection conductive pattern 18. Thus, the first conductive pattern 14a and the second conductive pattern 14b may function as a common bias line. As a result, it is possible to capture holes which may exist at a surface of the first substrate 1 being in contact with the pixel isolation portion DTI, and thus a dark current may be reduced or minimized.

The connection conductive pattern 18 may function as an interconnection line for applying a voltage to the first conductive pattern 14a and the second conductive pattern 14b. An electrical resistance of the material of the connection conductive pattern 18 may be less than an electrical resistance of the material of the first and second conductive patterns 14a and 14b. Thus, a voltage may be quickly applied to the first conductive pattern 14a and the second conductive pattern 14b through the connection conductive pattern 18. As a result, an operating speed of the image sensor 500 may be improved.

The insulating liner 12 may be disposed between the conductive structure 20 and the first substrate 1. Each of the insulating liner 12 and the first filling insulation pattern 16 may include an insulating material of which a refractive index is different from that of the first substrate 1. Here, a density of the insulating material included in the insulating liner 12 may be greater than a density of the insulating material included in the first filling insulation pattern 16. For example, the insulating liner 12 and the first filling insulation pattern 16 may include silicon oxide. Here, a density of the silicon oxide included in the insulating liner 12 may be greater than a density of the silicon oxide included in the first filling insulation pattern 16.

The second filling insulation pattern 22 may be disposed between the conductive structure 20 and the interlayer insulating layer IL. For example, the second filling insulation pattern 22 may include silicon oxide. The insulating liner 12 may be disposed between the shallow device isolation portion STI and the second filling insulation pattern 22. Although not shown in the drawings, the second filling insulation pattern 22 may have a mesh shape overlapping the pixel isolation portion DTI when viewed in a plan view. Bottom surfaces of the shallow device isolation portion STI, the insulating liner 12 and the second filling insulation pattern 22 may be substantially coplanar with each other and may protrude below the first surface 1a.

The pixel isolation portion DTI may prevent crosstalk between adjacent unit pixels UP and improve a modulation transfer function (MTF) characteristic. When a difference in refractive index between the pixel isolation portion DTI and the first substrate 1 increases, the effect of preventing the crosstalk may be increased and the MTF characteristic may be more improved. To this end, the pixel isolation portion DTI may include the air gap region AG corresponding to an air layer having the greatest refractive index difference from silicon of the first substrate 1. However, if the pixel isolation portion DTI includes only the air gap region AG, durability of the image sensor 500 may be deteriorated and a crack may occur at the first substrate 1. According to the embodiments of the disclosure, the pixel isolation portion DTI may further include the first filling insulation pattern 16, the insulating liner 12, and the conductive structure 20, and thus a crack of the first substrate 1 may be prevented and the durability of the image sensor 500 may be improved. The first filling insulation pattern 16 may maintain the air gap region AG in the pixel isolation portion DTI.

If the pixel isolation portion DTI includes the insulating liner 12 and a poly-silicon pattern in the deep trench 10 without the air gap region AG, poly-silicon may have a property of partially absorbing light, and thus the MTF characteristic may be deteriorated. Photosensitivity may be reduced by the deterioration of the MTF characteristic. If the insulating liner 12 has a relatively thick thickness to prevent the deterioration of the MTF characteristic, a voltage applied to the poly-silicon pattern may not affect the first substrate 1 by a strong insulating property of the insulating liner 12, and thus a dark current may be increased. In some embodiments, the insulating liner 12 may have a thickness of, for example, 100 Å to 250 Å, and thus the dark current may be reduced and/or minimized and the deterioration of the MTF characteristic may be minimized and/or prevented. As a result, the photosensitivity may be improved.

The pixel isolation portion DTI of the image sensor 500 according to some embodiments may include the insulating liner 12, the conductive structure 20, the first filling insulation pattern 16, and the air gap region AG. Thus, the crosstalk may be prevented, the MTF characteristic may be improved, and the dark current may be reduced or minimized. In addition, a crack of the first substrate 1 may be prevented, and the durability of the image sensor 500 may be improved.

Figure 5B:
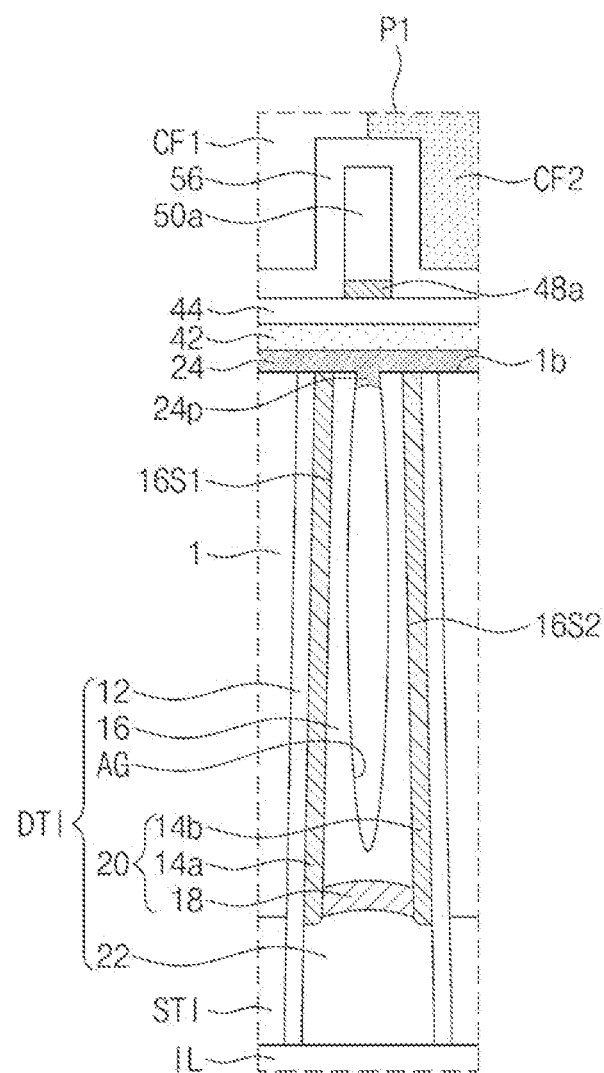

As illustrated in FIG. 5A, in the conductive structure 20, lower portions of the first and second conductive patterns 14a and 14b may protrude below a bottom surface of the connection conductive pattern 18. A top surface and the bottom surface of the connection conductive pattern 18 may be flat. Alternatively, as illustrated in FIG. 5B, each of the top and bottom surfaces of the connection conductive pattern 18 may be convex upward. Alternatively, as illustrated in FIG. 5C, bottom surfaces of the first and second conductive patterns 14a and 14b may be coplanar with the bottom surface of the connection conductive pattern 18, and the bottom surfaces of the conductive patterns 14a, 14b and 18 may be flat.

Figure 5C:
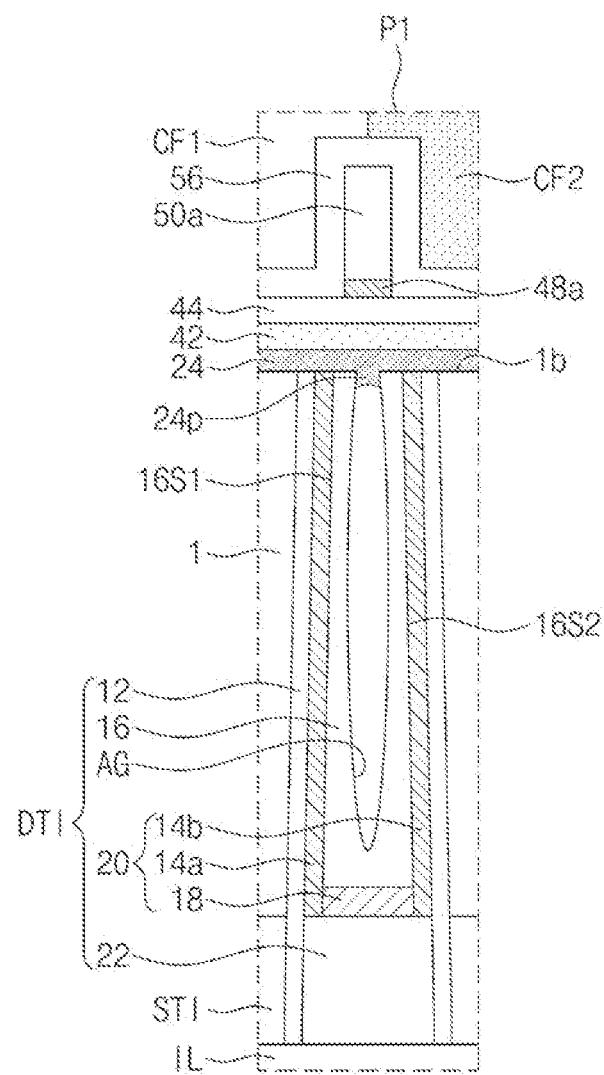
Figure 5D:
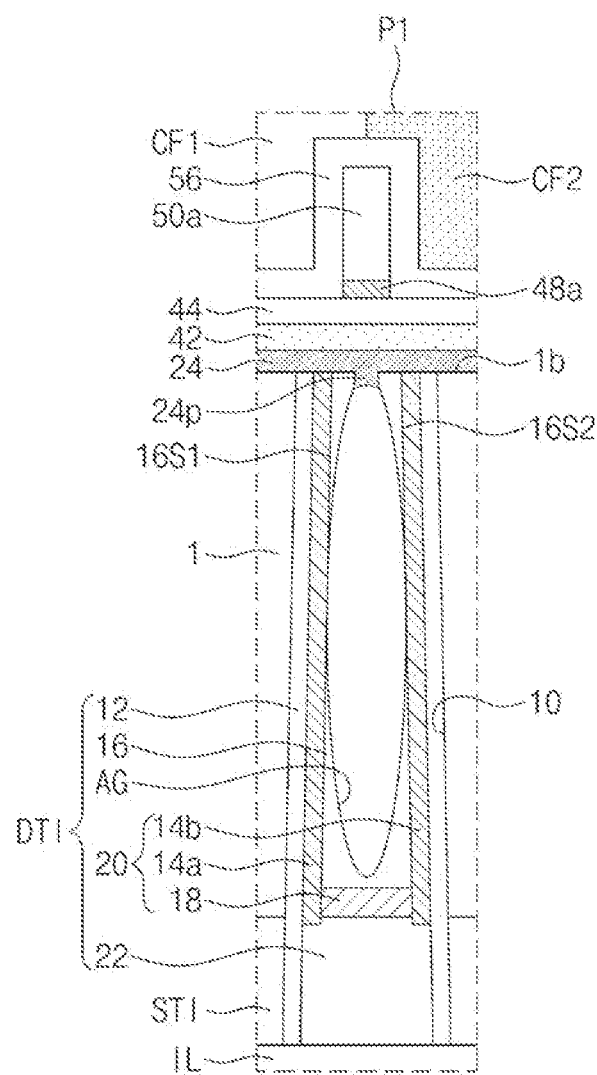

The air gap region AG may be spaced apart from entire inner sidewalls of the first and second conductive patterns 14a and 14b as illustrated in FIGS. 5A to 5C. Alternatively, the air gap region AG may expose portions of the inner sidewalls of the first and second conductive patterns 14a and 14b as illustrated in FIG. 5D.

The second surface 1b may be in contact with a first fixed charge layer 24. A protrusion 24p of the first fixed charge layer 24 may protrude downward to define a top end portion of the air gap region AG. The protrusion 24p of the first fixed charge layer 24 may be referred to as a fixed charge layer protrusion 24p. The first fixed charge layer 24 may be formed of a single layer or multi-layer including at least one of a metal oxide layer containing insufficient oxygen in terms of a stoichiometric ratio or a metal fluoride layer containing insufficient fluorine in terms of a stoichiometric ratio. Thus, the first fixed charge layer 24 may have negative fixed charges. The first fixed charge layer 24 may be formed of a single layer or multi-layer including a metal oxide layer and/or metal fluoride layer including at least one of hafnium (Hf), zirconium (Zr), aluminum (Al), tantalum (Ta), titanium (Ti), yttrium (Y), or a lanthanoid. For example, the first fixed charge layer 24 may include a hafnium oxide layer and/or an aluminum oxide layer. A dark current and a white spot may be minimized or prevented by the first fixed charge layer 24.

A second fixed charge layer 42 and a first protective layer 44 may be sequentially stacked on the first fixed charge layer 24. The second fixed charge layer 42 may include a single layer or multi-layer including at least one of a metal oxide layer or a metal fluoride layer. For example, the second fixed charge layer 42 may include a hafnium oxide layer and/or an aluminum oxide layer. The second fixed charge layer 42 may reinforce the first fixed charge layer 24 or may function as an adhesive layer. For example, the first protective layer 44 may include at least one of PETEOS, SiOC, SiO2, SiN, a hafnium oxide layer, or an aluminum oxide layer. The first protective layer 44 may function as an anti-reflection layer and/or a planarization layer.

Referring to FIGS. 3 and 4, in the edge region EG, a connection contact BCA may penetrate the first protective layer 44, the second fixed charge layer 42, the first fixed charge layer 24 and a portion of the first substrate 1 so as to be in contact with the first and second conductive patterns 14a and 14b of the conductive structure 20. The connection contact BCA may be disposed in a first trench 46. The connection contact BCA may include a diffusion barrier pattern 48b conformally covering an inner sidewall and a bottom surface of the first trench 46, a first metal pattern 52 on the diffusion barrier pattern 48b, and a second metal pattern 54 filling the first trench 46. The diffusion barrier pattern 48b may include, for example, titanium. The first metal pattern 52 may include, for example, tungsten. The second metal pattern 54 may include, for example, aluminum. The diffusion barrier pattern 48b and the first metal pattern 52 may extend onto the first protective layer 44 so as to be electrically connected to other interconnection lines or vias and/or contacts. In the edge region EG, a portion 48p of the diffusion barrier pattern 48b may protrude into the air gap region AG of the pixel isolation portion DTI to fill the air gap region AG. The portion 48p of the diffusion barrier pattern 48b may be referred to as a diffusion barrier protrusion 48p. The diffusion barrier protrusion 48p may not be in contact with the conductive structure 20 but may be spaced apart from the conductive structure 20 by the first filling insulation pattern 16. Alternatively, when the air gap region AG has the shape of FIG. 5D to expose the inner sidewalls of the first and second conductive patterns 14a and 14b, the diffusion barrier protrusion 48p may be in contact with the inner sidewalls of the first and second conductive patterns 14a and 14b.

In the pixel array region APS, a light blocking pattern 48a and a low-refractive index pattern 50a may be sequentially stacked on the first protective layer 44. In the pixel array region APS, the light blocking pattern 48a and the low-refractive index pattern 50a may have mesh shapes in a plan view and may overlap the pixel isolation portion DTI. The light blocking pattern 48a may have the same material and the same thickness as the diffusion barrier pattern 48b. The light blocking pattern 48a may include, for example, titanium. The low-refractive index pattern 50a may include an organic material. The low-refractive index pattern 50a may have a refractive index lower than those of color filters CF1 and CF2. For example, the low-refractive index pattern 50a may have a refractive index of about 1.3 or less. A sidewall of the low-refractive index pattern 50a may be aligned with a sidewall of the light blocking pattern 48a. The light blocking pattern 48a and the low-refractive index pattern 50a may prevent crosstalk between the unit pixels UP adjacent to each other.

A second protective layer 56 may be stacked on the first protective layer 44. The second protective layer 56 may conformally cover the low-refractive index pattern 50a, the light blocking pattern 48a, and the connection contact BCA. In the pixel array region APS, color filters CF1 and CF2 may be disposed between portions of the low-refractive index pattern 50a and may be arranged in an array form. Each of the color filters CF1 and CF2 may correspond to one of a blue color, a green color and a red color. The color filters CF1 and CF2 may be arranged, for example, in the form of a Bayer pattern, a 2×2 tetra-pattern, or a 3×3 nona-pattern. Alternatively, each of the color filters CF1 and CF2 may correspond to another color such as a cyan color, a magenta color, or a yellow color.

In the edge region EG, a first optical black pattern CFB may be disposed on the second protective layer 56. For example, the first optical black pattern CFB may include the same material as the blue color filter. A micro lens array layer ML may be disposed on the color filters CF1 and CF2. The micro lens array layer ML may include convex lens portions overlapping the unit pixels UP, respectively. A portion of the micro lens array layer ML may extend onto the first optical black pattern CFB.

FIGS. 6A to 6K are cross-sectional views illustrating a method of manufacturing an image sensor of FIG. 4.

Figure 6A:
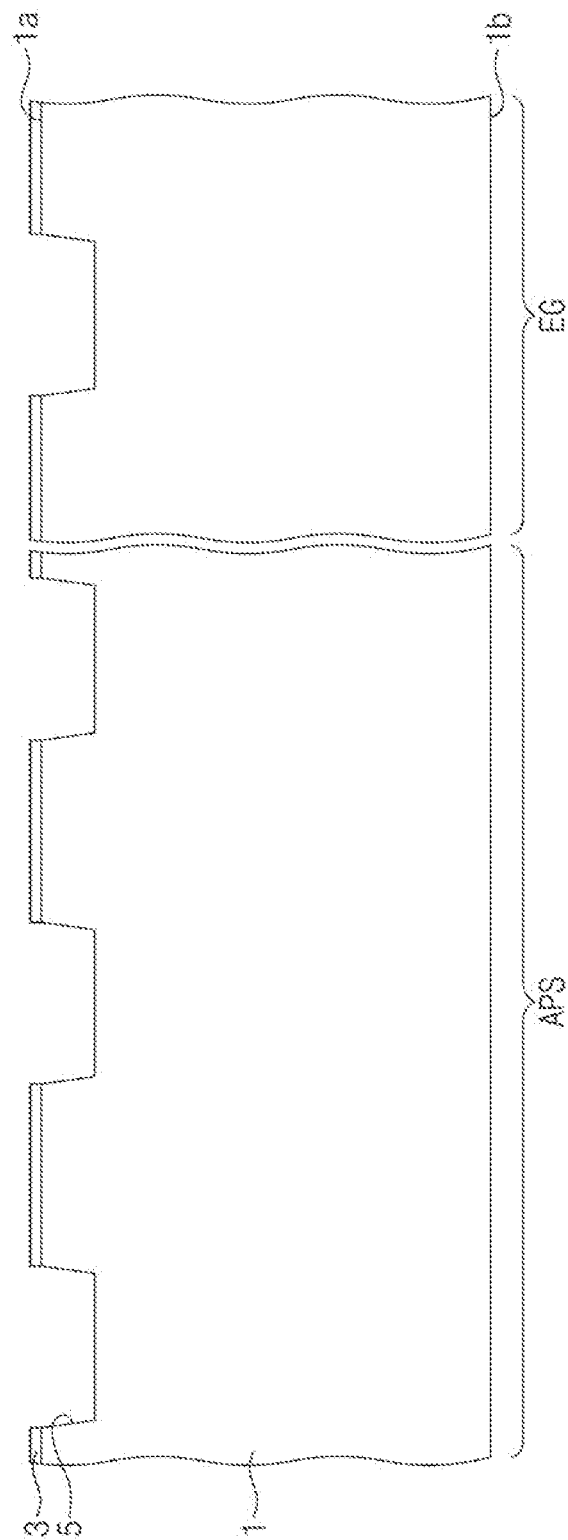
FIGS. 6A, 6B, 6C, 6D, 6E, 6F, 6G, 6H, 6I, 6J, and 6K are cross-sectional views illustrating a method of manufacturing an image sensor of FIG. 4.

Referring to FIG. 6A, a first substrate 1 including a pixel array region APS and an edge region EG may be prepared. The first substrate 1 may include a first surface 1a and a second surface 1b which are opposite to each other. The first substrate 1 may be a single-crystalline silicon wafer or a silicon epitaxial layer. A first mask layer may be formed on the first surface 1a of the first substrate 1 and then may be patterned to form a first mask pattern 3. The first mask pattern 3 may have an opening defining a position of a shallow device isolation portion. For example, the first mask pattern 3 may include silicon nitride. The first substrate 1 may be etched using the first mask pattern 3 as an etch mask to form a shallow trench 5.

Figure 6B:
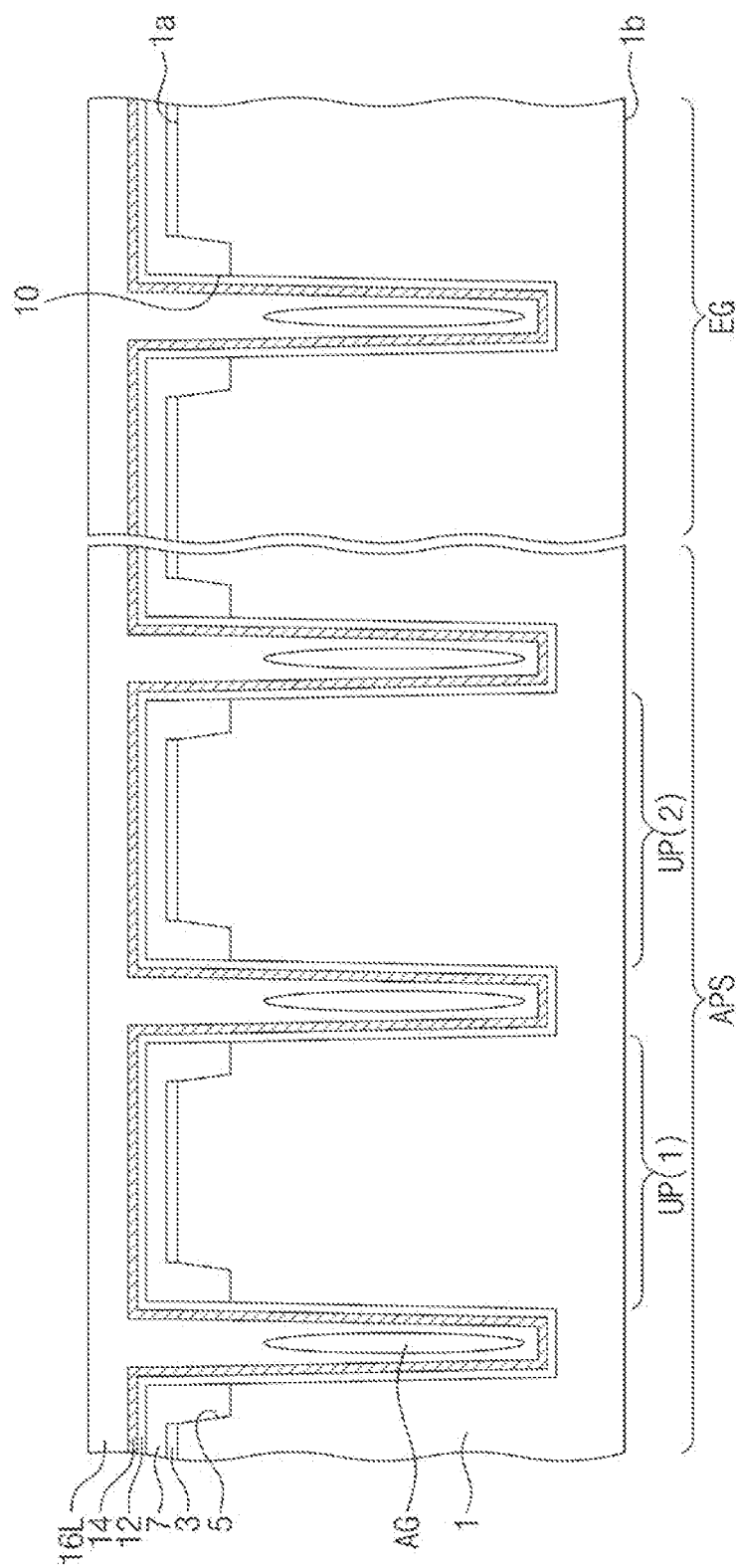

Referring to FIG. 6B, a device isolation layer may be stacked on the first surface 1a of the first substrate 1 to fill the shallow trench 5 and then may be patterned to form a device isolation pattern 7. The device isolation pattern 7 may cover the first mask pattern 3. The device isolation pattern 7 may include, for example, a silicon oxide layer. The device isolation pattern 7 may have an opening defining a position of a deep trench 10. The device isolation pattern 7 may cover a portion of a bottom surface and a sidewall of the shallow trench 5. The first substrate 1 may be etched using the device isolation pattern 7 as an etch mask to form the deep trench 10.

Next, an insulating liner 12 and a first conductive layer 14 may be sequentially and conformally stacked on the whole of the first surface 1a of the first substrate 1 in which the deep trench 10 is formed. The insulating liner 12 and the first conductive layer 14 may not completely fill the deep trench 10. The insulating liner 12 and the first conductive layer 14 may be formed by a deposition process having excellent step coverage characteristics. For example, the insulating liner 12 may be formed by a thermal oxidation process or an atomic layer deposition (ALD) process. The insulating liner 12 may be formed of, for example, silicon oxide. The first conductive layer 14 may be formed of poly-silicon doped with dopants. A first filling insulation layer 16L may be formed on the first conductive layer 14. At this time, the first filling insulation layer 16L may be formed by a deposition process having poor step coverage characteristics. For example, the first filling insulation layer 16L may be formed by a low-pressure chemical vapor deposition (LPCVD) process. Thus, the first filling insulation layer 16L may be formed to include an air gap region AG in the deep trench 10. The first filling insulation layer 16L may be formed of, for example, silicon oxide or tetraethylorthosilicate (TEOS). Here, a density of silicon oxide of the first filling insulation layer 16L may be less than a density of silicon oxide of the insulating liner 12.

Figure 6C:
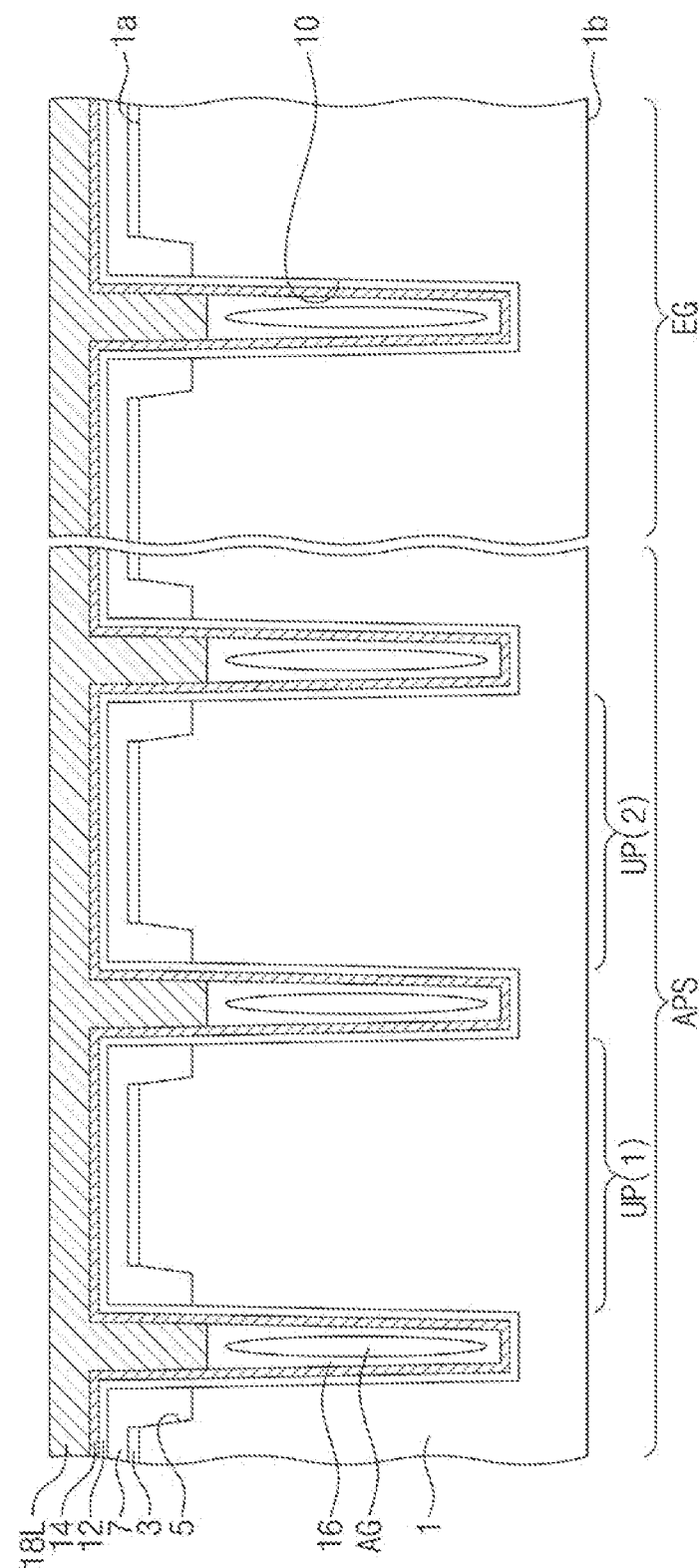

Referring to FIGS. 6B and 6C, an etch-back process may be performed on the first filling insulation layer 16L to remove the first filling insulation layer 16L provided on the device isolation pattern 7 and to leave a first filling insulation pattern 16 corresponding to a portion of the first filling insulation layer 16L in the deep trench 10. At this time, the air gap region AG may not be exposed. In this state, a second conductive layer 18L may be formed on the first surface 1a of the first substrate 1. The second conductive layer 18L may be formed of poly-silicon doped with dopants, or a metal containing layer. The second conductive layer 18L may fill an upper portion of the deep trench 10. At this time, due to the first filling insulation pattern 16, the second conductive layer 18L may not enter the air gap region AG. Thus, the air gap region AG may be maintained by the first filling insulation pattern 16. If the first filling insulation pattern 16 is not provided, the second conductive layer 18L may fill the deep trench 10, and thus formation of an air gap may be difficult. In addition, it may be difficult to form the air gap region AG in a process of depositing a poly-silicon layer, or even if the air gap region AG is formed, it may be difficult to uniformly adjust a thickness of the poly-silicon layer on an inner sidewall of the deep trench 10.

Figure 6D:
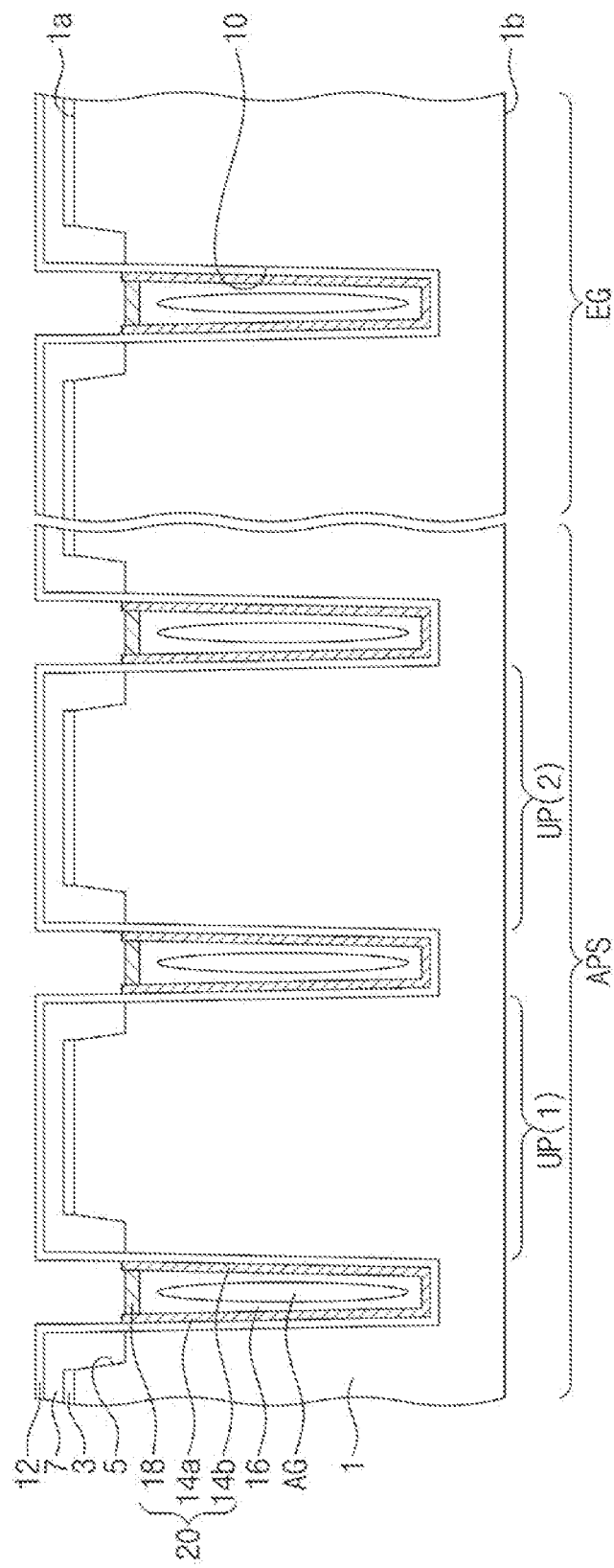

Referring to FIGS. 6C and 6D, an etch-back process may be performed on the second conductive layer 18L and the first conductive layer 14 to remove portions of the first and second conductive layers 14 and 18L provided on the device isolation pattern 7. Thus, the insulating liner 12 may be exposed, and a first conductive pattern 14a, a second conductive pattern 14b and a connection conductive pattern 18 may be formed in the deep trench 10. As a result, a conductive structure 20 may be formed.

Figure 6E:
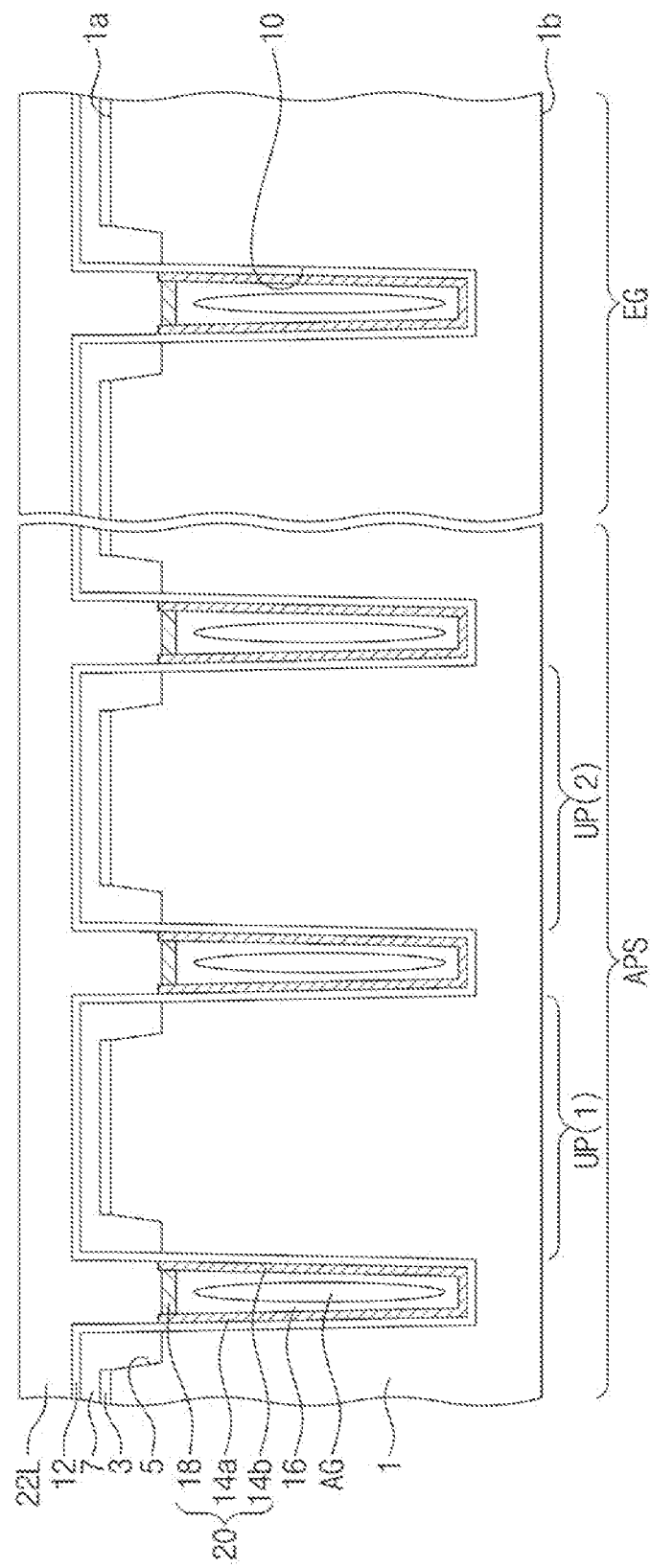

Referring to FIG. 6E, a second filling insulation layer 22L may be formed on the insulating liner 12 to fill an upper portion of the deep trench 10. The second filling insulation layer 22L may be formed of a middle temperature oxide (MTO) or a high density plasma (HDP) oxide. In addition, an annealing process may be performed. By the annealing process, dopants in the conductive structure 20 may be activated and a phase of the poly-silicon may be changed from an amorphous state into a crystalline state.

Figure 6F:
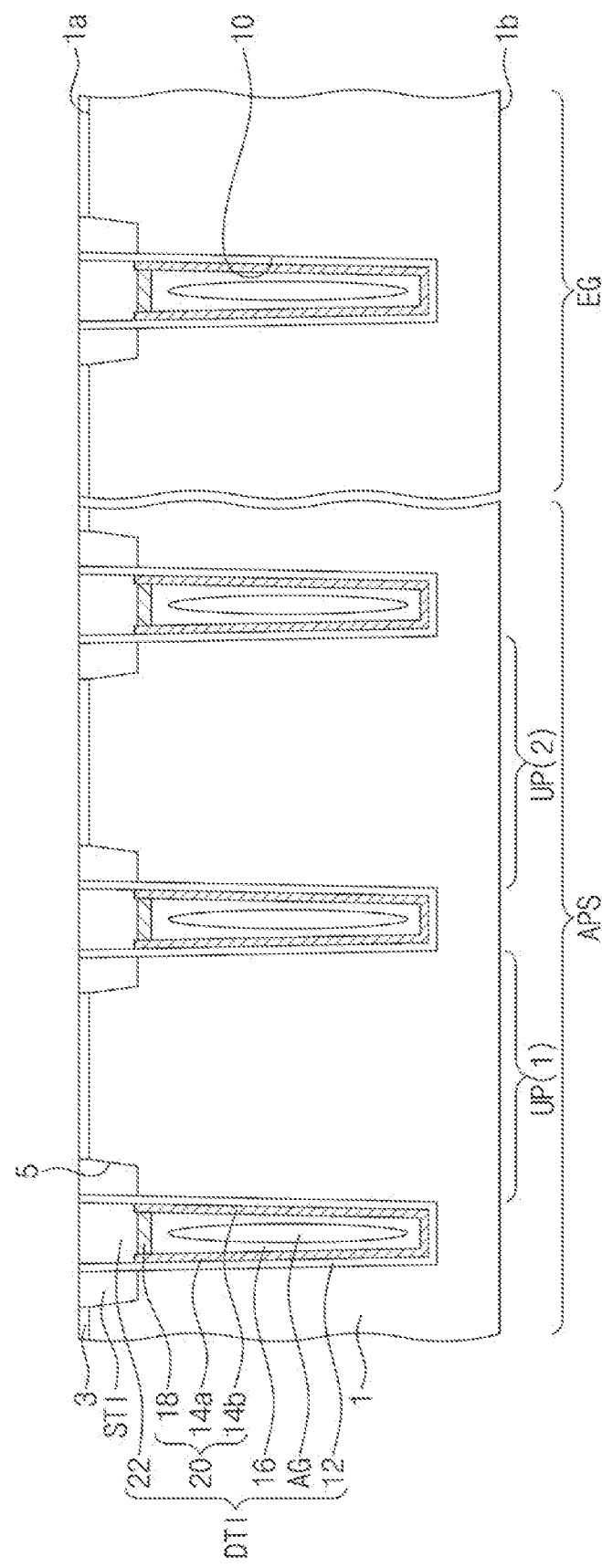

Referring to FIG. 6F, a chemical mechanical polishing (CMP) process may be performed to remove the device isolation pattern 7, the insulating liner 12 and the second filling insulation layer 22L on the first mask pattern 3 and to expose the first mask pattern 3. At this time, a shallow device isolation portion STI corresponding to a portion of the device isolation pattern 7 may be formed. The first mask pattern 3 may function as a CMP stop layer.

Figure 6G:
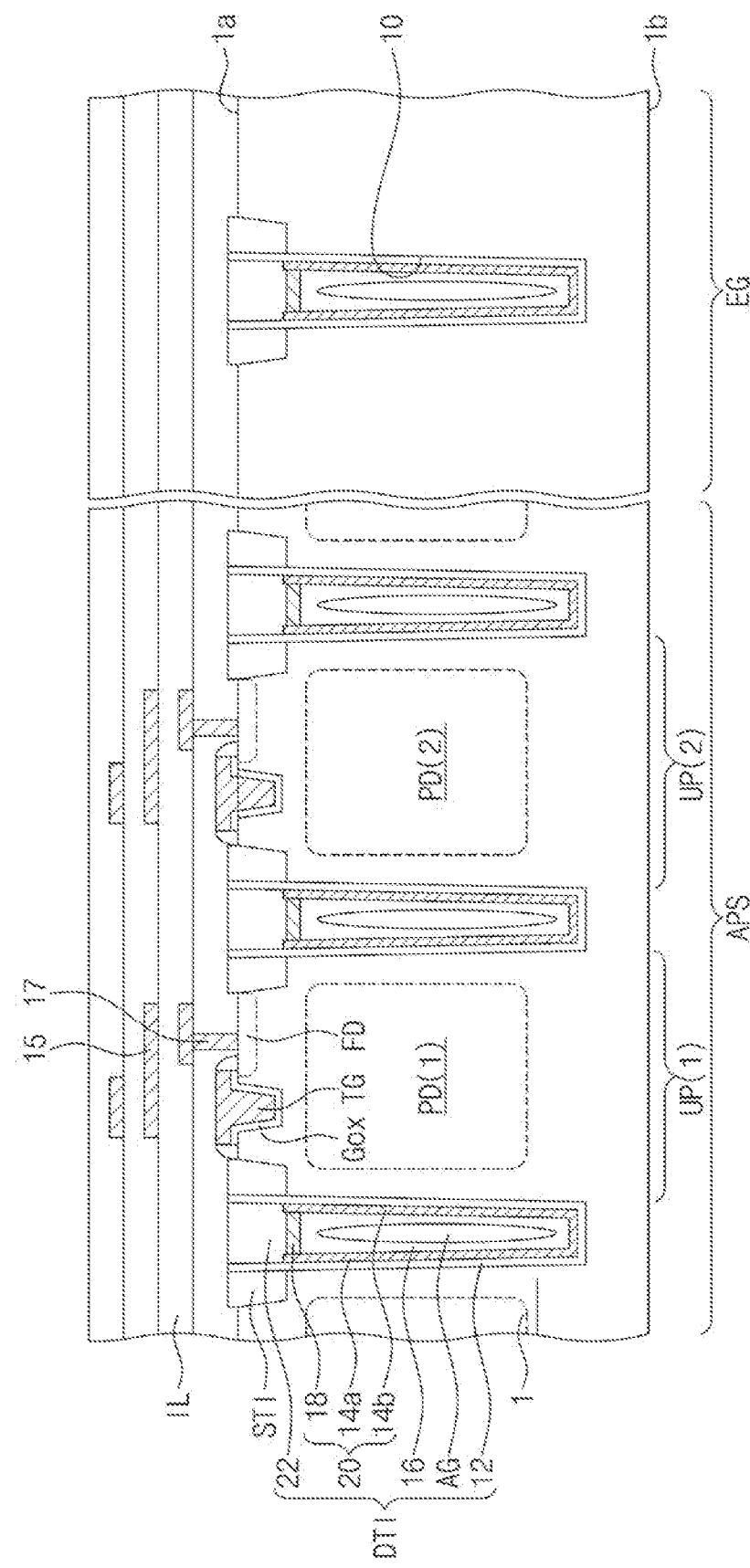

Referring to FIG. 6G, the first mask pattern 3 may be removed to expose the first surface 1a of the first substrate 1. An ion implantation process, etc. may be performed on the first substrate 1 to form photoelectric conversion portions PD. A gate insulating layer Gox, transfer gates TG, floating diffusion regions FD, first contact plugs 17, first interconnection lines 15 and first interlayer insulating layers IL may be formed on the first surface 1a of the first substrate 1 through various processes.

Figure 6H:
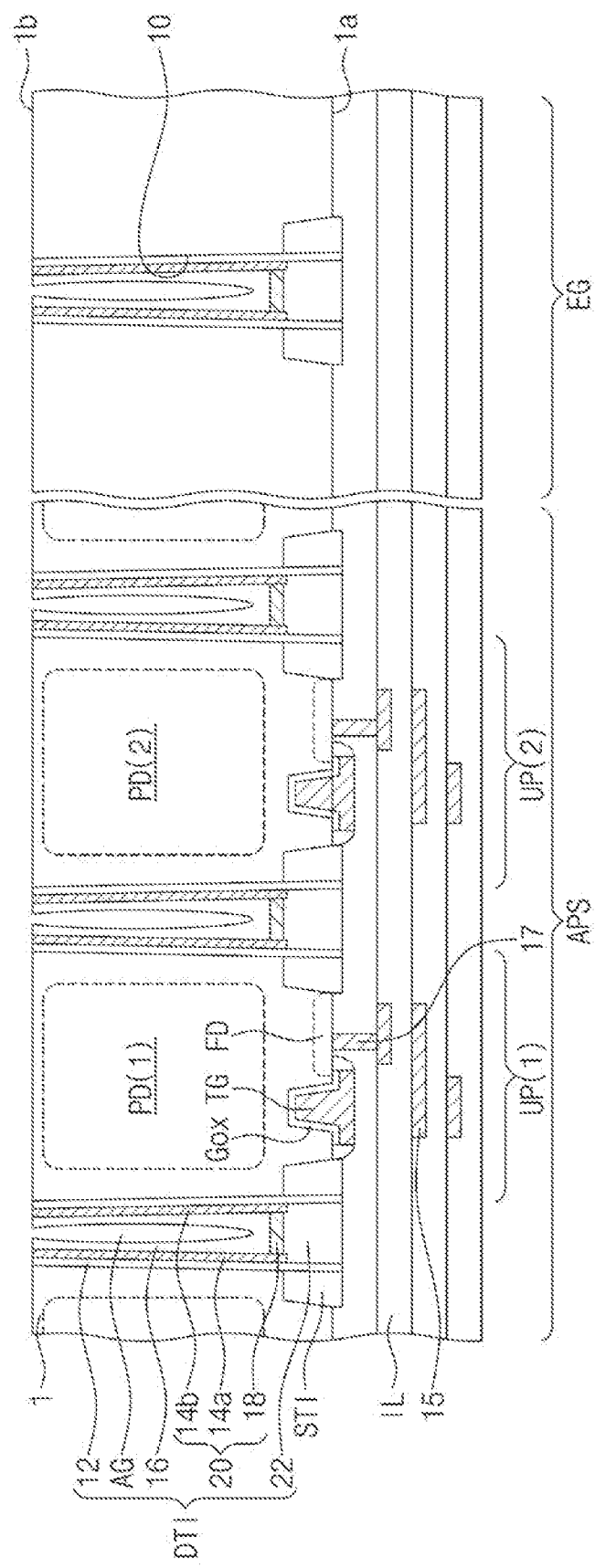

Referring to FIG. 6H, a back grinding process may be performed to remove a portion of the first substrate 1 and a portion of the pixel isolation portion DTI, which are adjacent to the second surface 1b. At this time, portions of the insulating liner 12, the first and second conductive patterns 14a and 14b and the first filling insulation pattern 16 of the pixel isolation portion DTI may be removed, and the air gap region AG may be exposed.

Figure 6I:
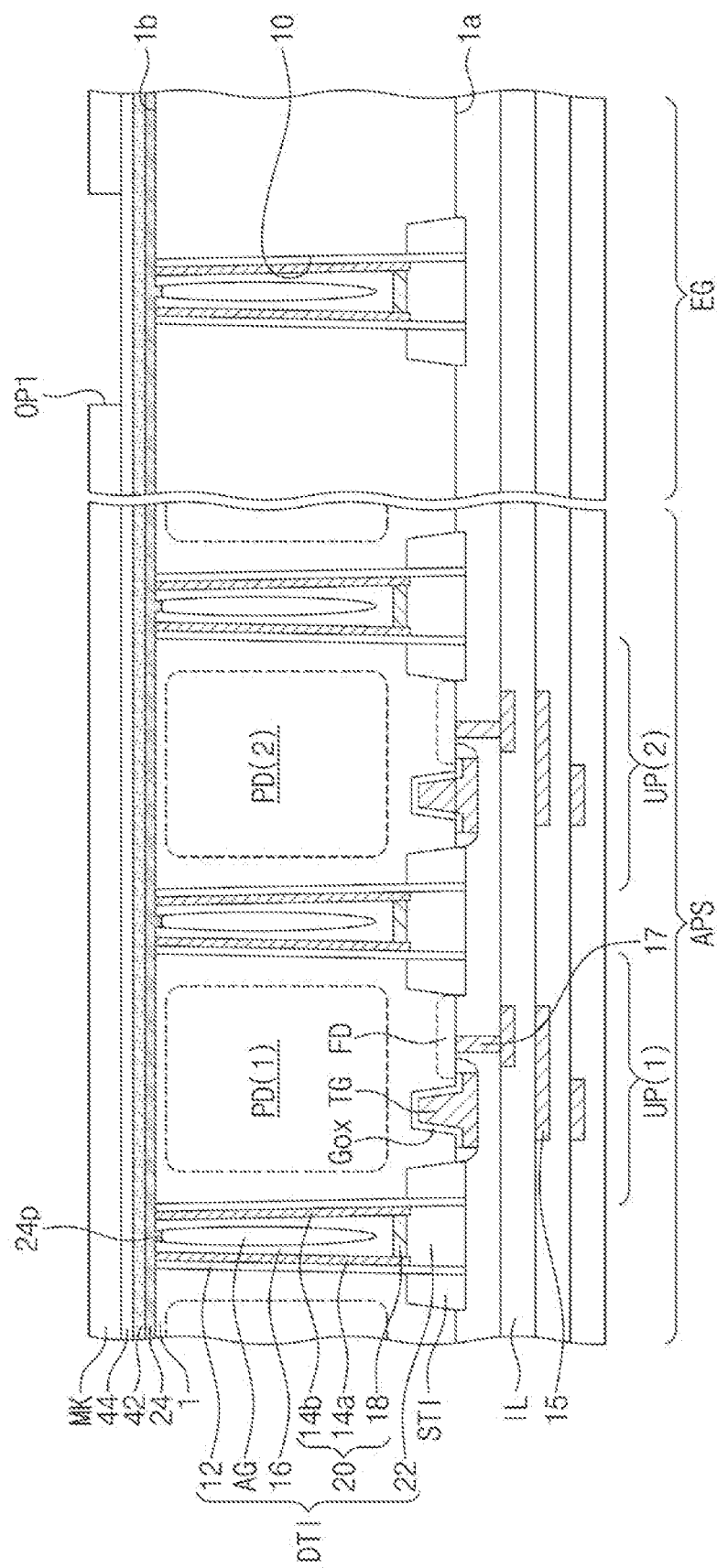

Referring to FIG. 6I, a first fixed charge layer 24 may be formed or stacked on the second surface 1b. At this time, a portion 24p of the first fixed charge layer 24 may protrude to an entrance of the air gap region AG and may close the entrance of the air gap region AG. A second fixed charge layer 42 and a first protective layer 44 may be sequentially stacked on the first fixed charge layer 24. A second mask pattern MK may be formed on the first protective layer 44. The second mask pattern MK may have a first opening OP1 exposing a portion of the edge region EG.

Figure 6J:
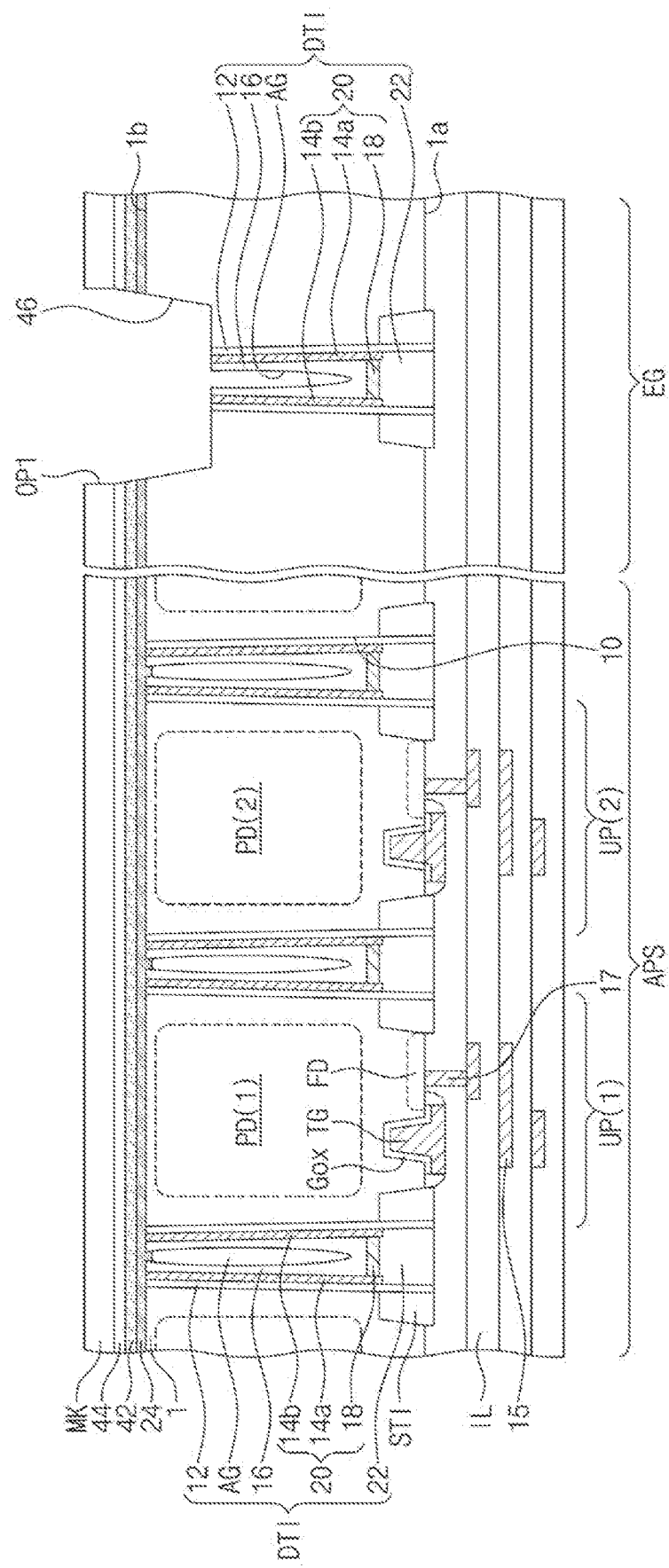

Referring to FIG. 6J, in the edge region EG, the first protective layer 44, the second fixed charge layer 42, the first fixed charge layer 24, the first substrate 1 and a portion of the pixel isolation portion DTI may be etched using the second mask pattern MK as an etch mask to form a first trench 46 exposing the first and second conductive patterns 14a and 14b of the pixel isolation portion DTI. At this time, the air gap region AG may be exposed at a bottom surface of the first trench 46.

Figure 6K:
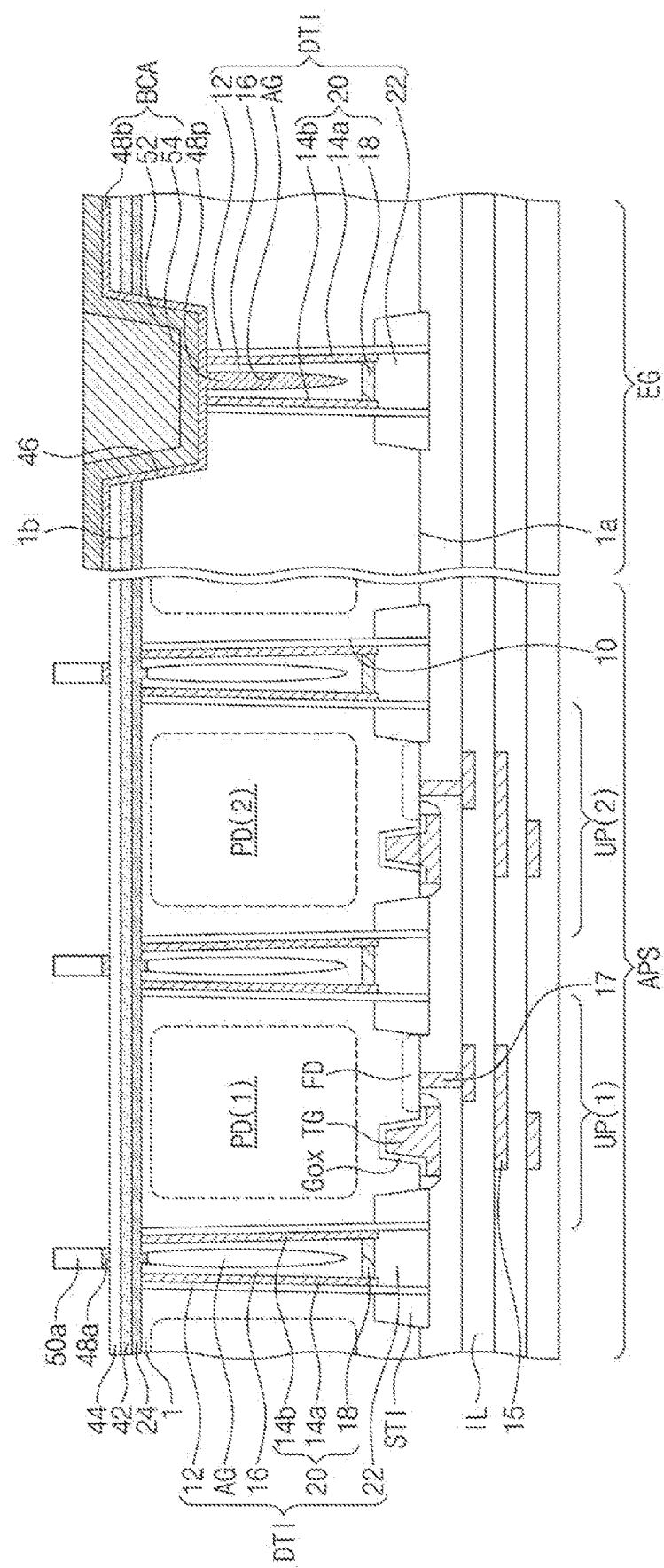

Referring to FIGS. 6J and 6K, the second mask pattern MK may be removed. A diffusion barrier layer and a first metal layer may be sequentially formed on the first protective layer 44. At this time, a portion 48p of the diffusion barrier layer may enter the air gap region AG exposed at the bottom surface of the first trench 46 and thus may fill the air gap region AG. The first metal layer may be etched to form a first metal pattern 52 in the edge region EG. The diffusion barrier layer may be etched to form a light blocking pattern 48a in the pixel array region APS and a diffusion barrier pattern 48b in the edge region EG at the same time. A low-refractive index pattern 50a may be formed on the light blocking pattern 48a in the pixel array region APS. A second metal pattern 54 filling the first trench 46 may be formed. The second metal pattern 54, the first metal pattern 52 and the diffusion barrier pattern 48b may constitute a connection contact BCA.

Subsequently, referring to FIG. 4, a second protective layer 56 may be conformally formed on the first protective layer 44 and the connection contact BCA.

Color filters CF1 and CF2 may be formed between portions of the low-refractive index pattern 50a on the second protective layer 56. At this time, a first optical black pattern CFB may also be formed in the edge region EG. A micro lens array layer ML may be formed on the color filters CF1 and CF2 and the first optical black pattern CFB. Thus, the image sensor 500 of FIG. 4 may be manufactured.

In the method of manufacturing the image sensor according to the embodiments of the disclosure, the image sensor having the pixel isolation portion, which improves the MTF characteristics and reduces or minimizes the dark current, may be stably manufactured without a process defect, and a yield may be improved.

Figure 7:
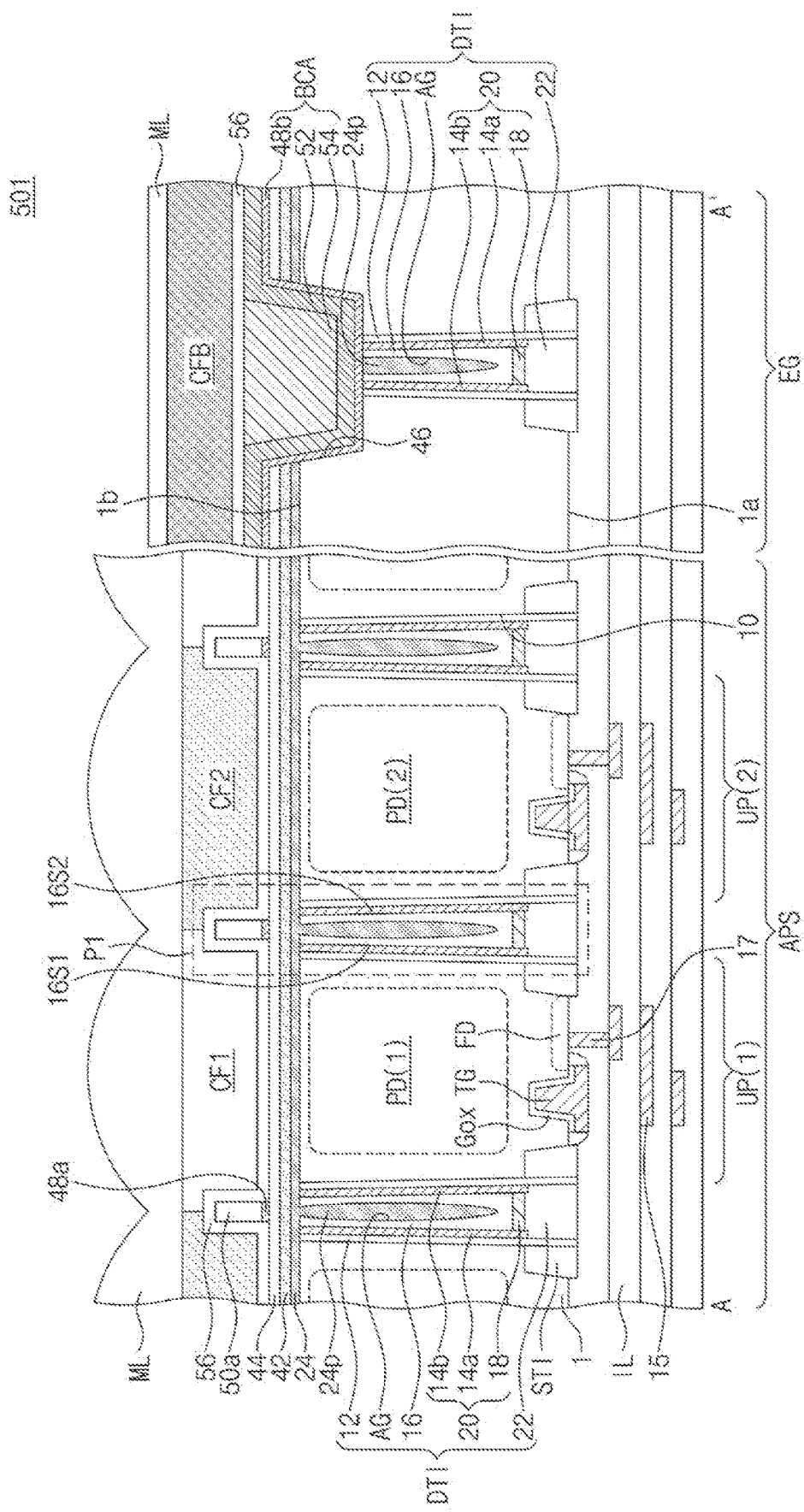
FIG. 7 is a cross-sectional view taken along the line A-A' of FIG. 3 according to some example embodiments of the disclosure.
Figure 8A:
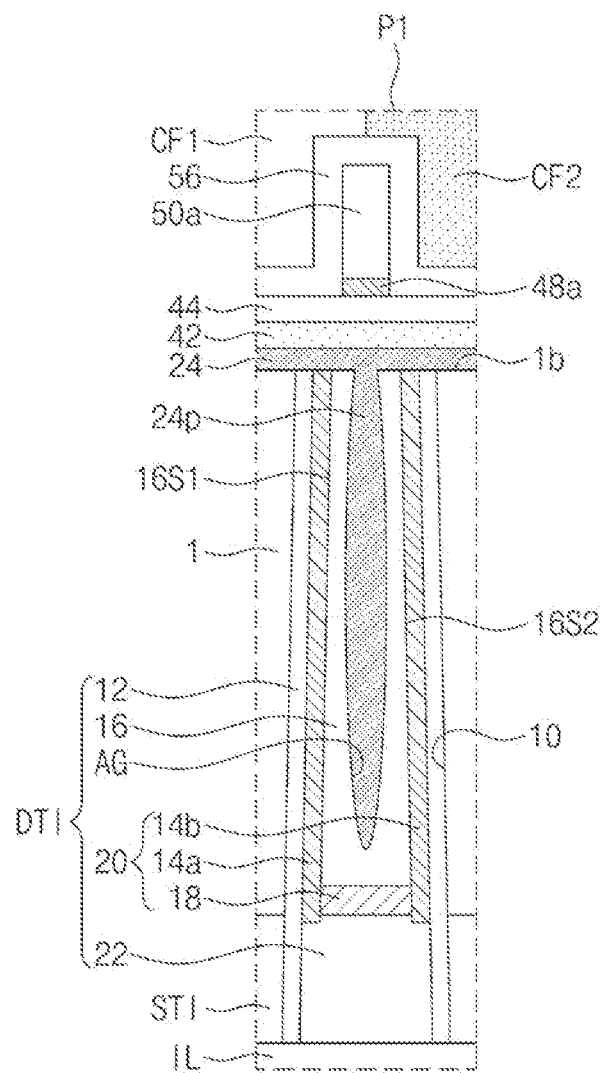
FIGS. 8A and 8B are enlarged views of a portion 'P1' of FIG. 7 according to some example embodiments of the disclosure.
Figure 8B:
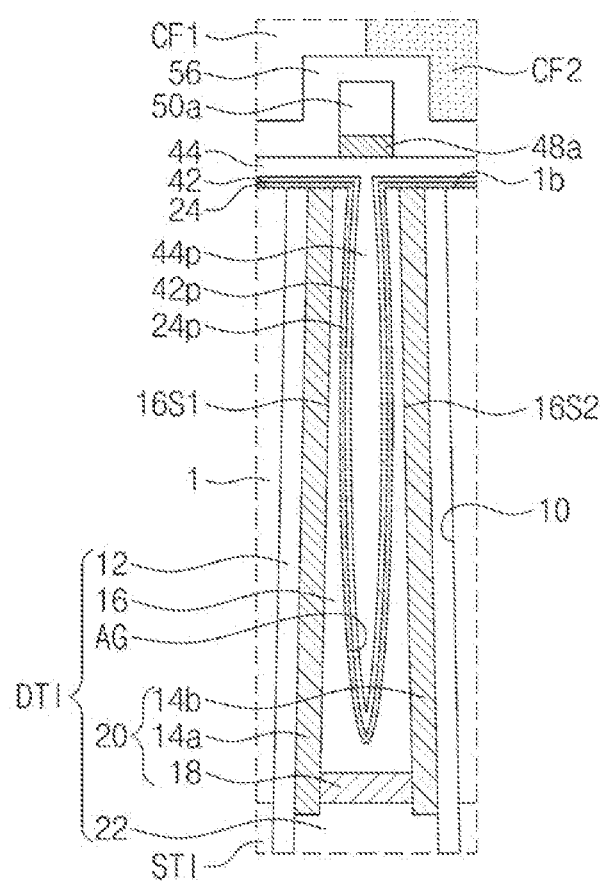

FIG. 7 is a cross-sectional view taken along the line A-A' of FIG. 3 according to some embodiments of the disclosure. FIGS. 8A and 8B are enlarged views of a portion 'P1' of FIG. 7 according to some embodiments of the disclosure.

Referring to FIGS. 7 and 8A, in an image sensor 501 according to some embodiments, portions 24p of the first fixed charge layer 24 of the pixel array region APS and the edge region EG may enter the air gap regions AG to fill the air gap regions AG, respectively. The portions 24p of the first fixed charge layer 24 may be referred to as fixed charge layer protrusions 24p. Unlike FIG. 4, in the edge region EG, a portion of the diffusion barrier pattern 48b may not enter the air gap region AG. In some embodiments, a bottom surface of the diffusion barrier pattern 48b may be in contact with a top surface of the fixed charge layer protrusion 24p. The protrusion 24p of the first fixed charge layer 24 may not be in contact with the conductive structure 20 but may be spaced apart from the conductive structure 20 by the first filling insulation pattern 16. Alternatively, when the air gap region AG of some embodiments has the shape of FIG. 5D to expose the inner sidewalls of the first and second conductive patterns 14a and 14b, the protrusion 24p of the first fixed charge layer 24 may be in contact with the inner sidewalls of the first and second conductive patterns 14a and 14b. Other structures and/or components of the image sensor 501 according to some embodiments may be the same or similar to those described above.

Even if the air gap region AG is filled with the fixed charge layer protrusion 24p, the first fixed charge layer 24 may include a material (e.g., an aluminum oxide layer and/or a hafnium oxide layer) having a high refractive index, and thus light obliquely incident to a sidewall of the pixel isolation portion DTI may be totally reflected. As a result, crosstalk between the unit pixels UP may be prevented and the MTF characteristics may be improved.

Alternatively, as illustrated in FIG. 8B, a protrusion 24p of the first fixed charge layer 24, a protrusion 42p of the second fixed charge layer 42 and a protrusion 44p of the first protective layer 44 may be inserted in the air gap region AG. The protrusion 24p of the first fixed charge layer 24, the protrusion 42p of the second fixed charge layer 42 and the protrusion 44p of the first protective layer 44 may conformally cover an inner sidewall of the first filling insulation pattern 16 in the air gap region AG. The protrusion 44p of the first protective layer 44 may fill the air gap region AG. In some embodiments, for example, the first fixed charge layer 24 may include aluminum oxide, the second fixed charge layer 42 may include hafnium oxide, and the first protective layer 44 may include aluminum oxide. When the pixel isolation portion DTI has the structure of FIG. 8B, in the edge region EG, the connection contact BCA may be in contact with the protrusion 24p of the first fixed charge layer 24, the protrusion 42p of the second fixed charge layer 42 and the protrusion 44p of the first protective layer 44.

Figure 9A:
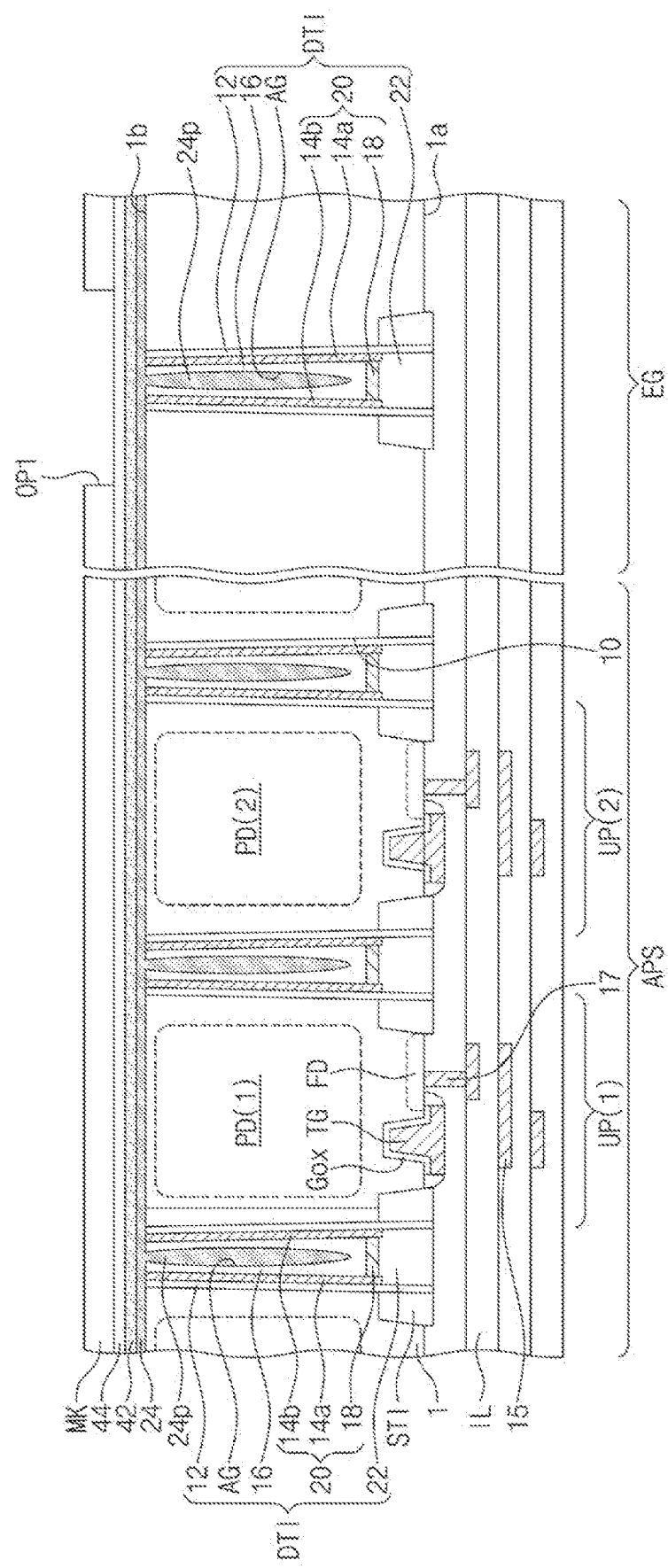
FIGS. 9A and 9B are cross-sectional views illustrating a method of manufacturing an image sensor of FIG. 7.
Figure 9B:
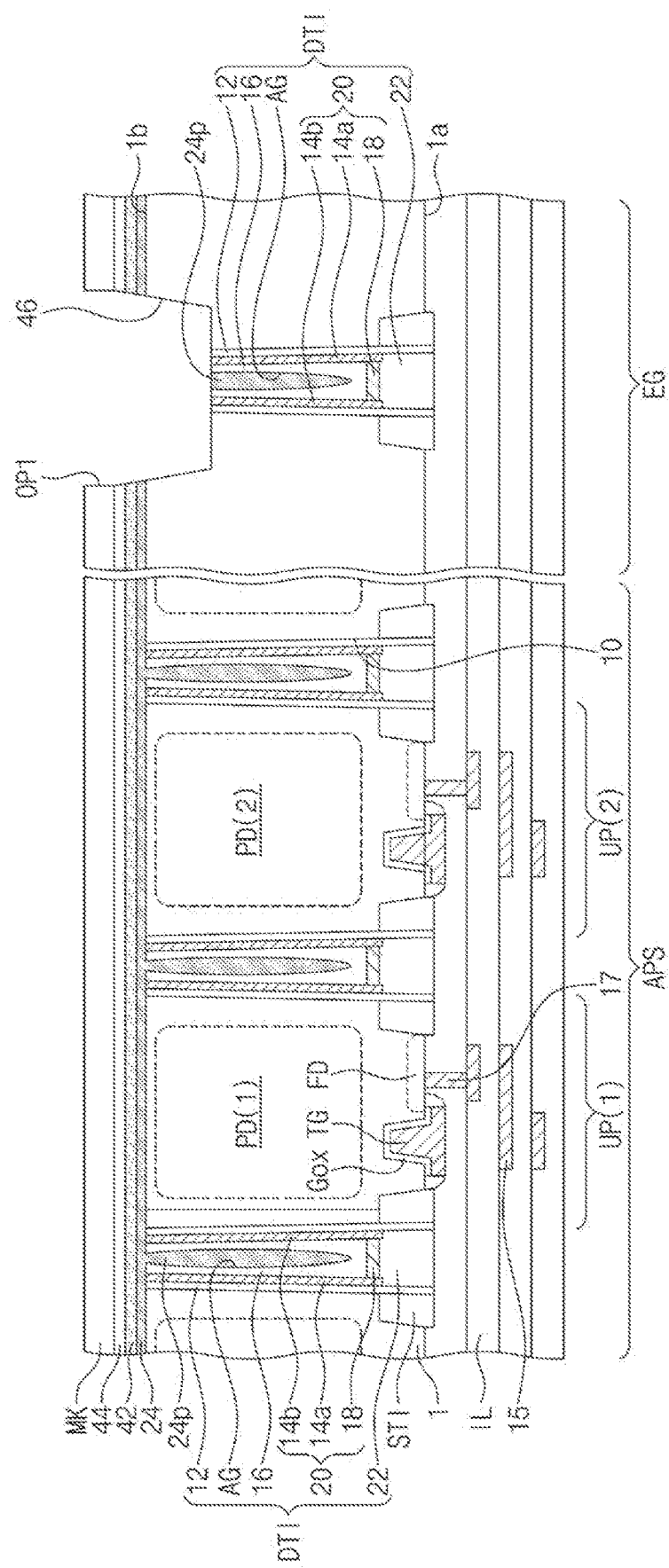

FIGS. 9A and 9B are cross-sectional views illustrating a method of manufacturing an image sensor of FIG. 7.

Referring to FIG. 9A, when a first fixed charge layer 24 is formed on the second surface 1b in the step of FIG. 6H, a portion (or a protrusion) 24p of the first fixed charge layer 24 may be inserted into the exposed air gap region AG to fill the air gap region AG. A second fixed charge layer 42 and a first protective layer 44 may be sequentially formed on the first fixed charge layer 24. A second mask pattern MK may be formed on the first protective layer 44.

Referring to FIG. 9B, in the edge region EG, the first protective layer 44, the second fixed charge layer 42, the first fixed charge layer 24, the first substrate 1 and a portion of the pixel isolation portion DTI may be etched using the second mask pattern MK as an etch mask to form a first trench 46 exposing the first and second conductive patterns 14a and 14b of the pixel isolation portion DTI. At this time, the protrusion 24p of the first fixed charge layer 24 may be exposed at a bottom surface of the first trench 46. Subsequently, the processes described with reference to FIG. 6K may be performed.

Figure 10:
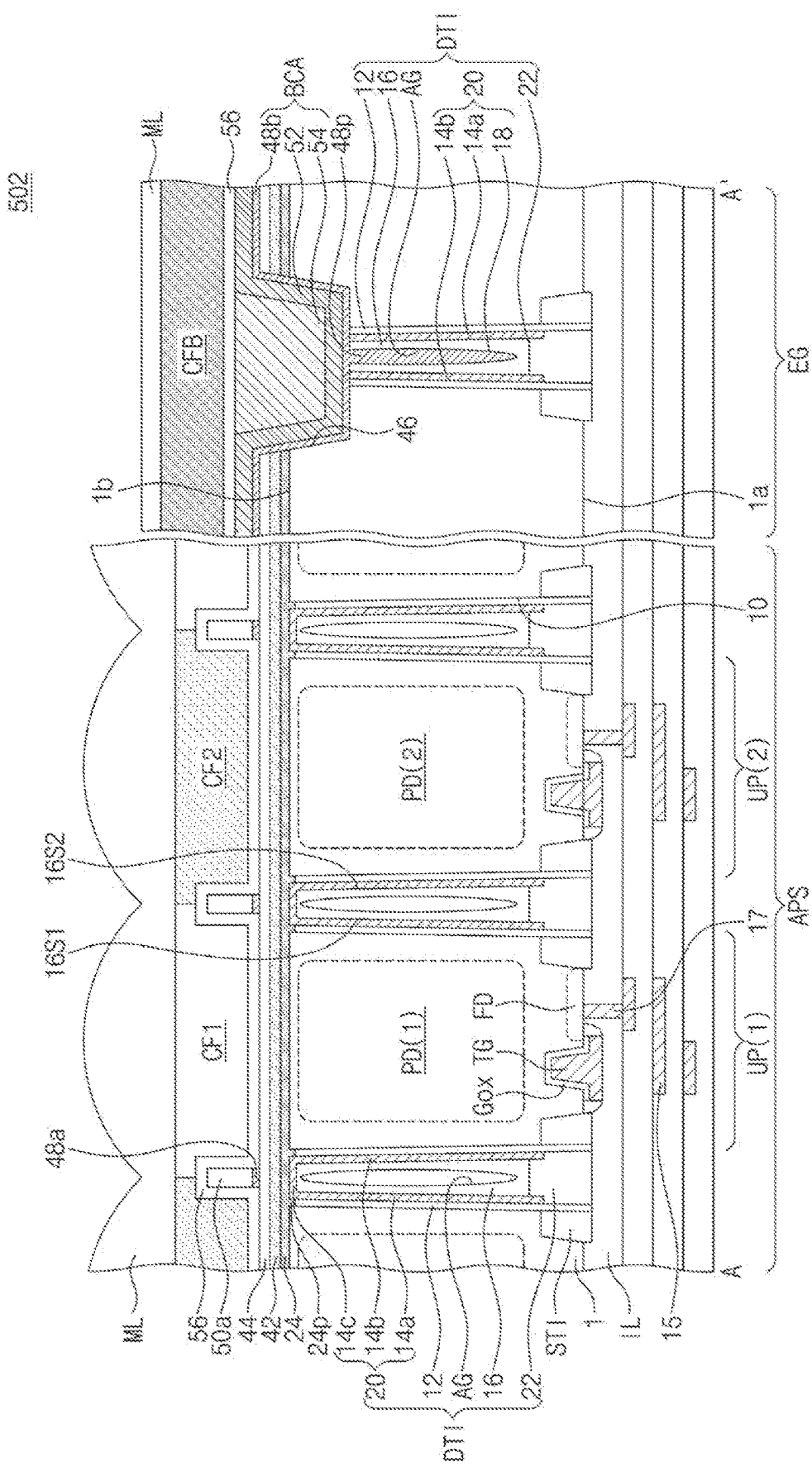
FIG. 10 is a cross-sectional view taken along the line A-A' of FIG. 3 according to some example embodiments of the disclosure.

FIG. 10 is a cross-sectional view taken along the line A-A' of FIG. 3 according to some embodiments of the disclosure.

Referring to FIG. 10, in an image sensor 502 according to some embodiments, a conductive structure 20 may include a first conductive portion 14a, a second conductive portion 14b, and a connection conductive portion 14c. The first conductive portion 14a, the second conductive portion 14b and the connection conductive portion 14c may be formed of the same material in one body. The first conductive portion 14a, the second conductive portion 14b and the connection conductive portion 14c may include poly-silicon doped with the same kind of dopants at the same concentration. The connection conductive portion 14c may have the same planar shape as the connection conductive pattern 18 of FIG. 3. The connection conductive portion 14c may be disposed between the first filling insulation pattern 16 and the first fixed charge layer 24 and may be in contact with the first filling insulation pattern 16 and the first fixed charge layer 24. A top surface of the insulating liner 12 may be lower than a top surface of the connection conductive portion 14c and/or the second surface 1b. A protrusion 24p of the first fixed charge layer 24 may be disposed between the first substrate 1 and the conductive structure 20 and may be in contact with the top surface of the insulating liner 12. Other structures and/or components of the image sensor 502 according to some embodiments may be the same or similar to those described above.

FIGS. 11A to 11D are cross-sectional views illustrating a method of manufacturing an image sensor of FIG. 10.

Figure 11A:
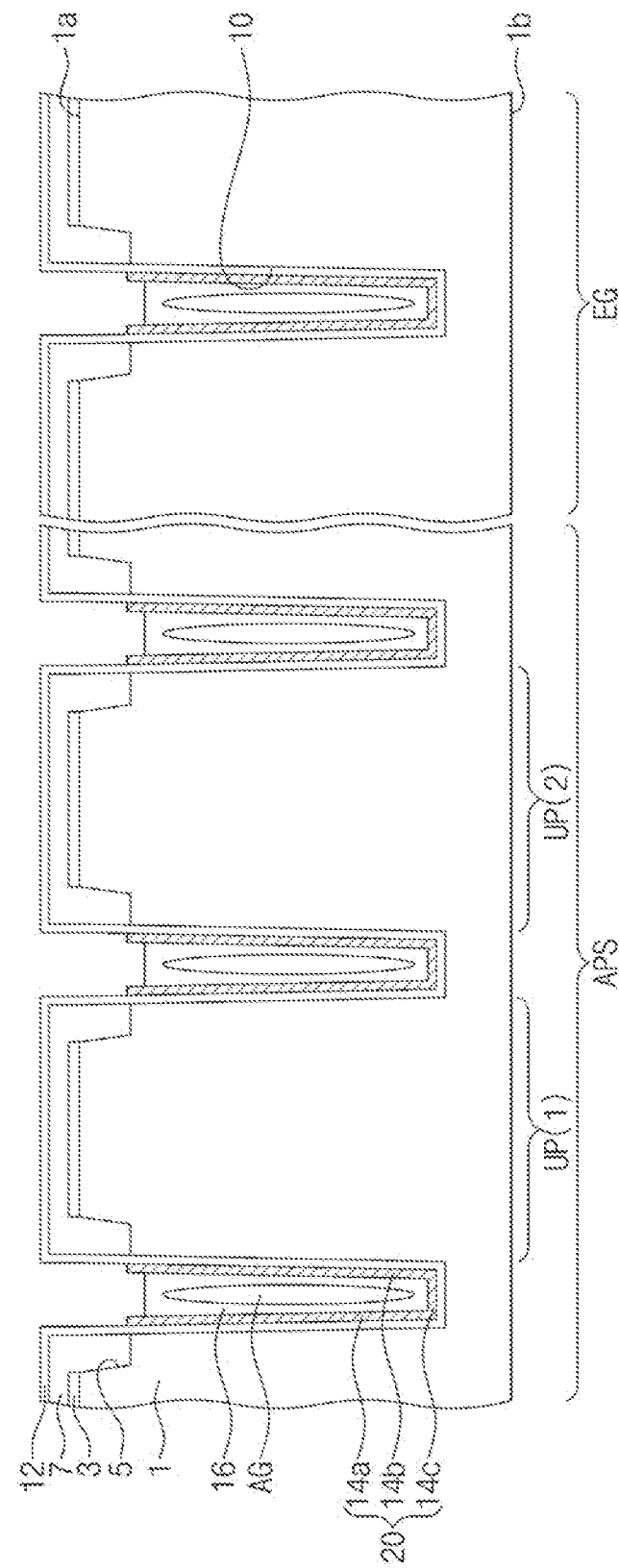
FIGS. 11A, 11B, 11C, and 11D are cross-sectional views illustrating a method of manufacturing an image sensor of FIG. 10.

Referring to FIG. 11A, in the step of FIG. 6C, after the formation of the first filling insulation pattern 16, the second conductive layer 18L may not be formed, but an etching process may be performed on the first conductive layer 14 to remove the first conductive layer 14 provided on the device isolation pattern 7 and to form a conductive structure 20 including a first conductive portion 14a, a second conductive portion 14b, and a connection conductive portion 14c. The etching process may be anisotropically or isotropically performed. The processes described with reference to FIGS. 6E to 6G may be performed in the state of FIG. 11A.

Figure 11B:
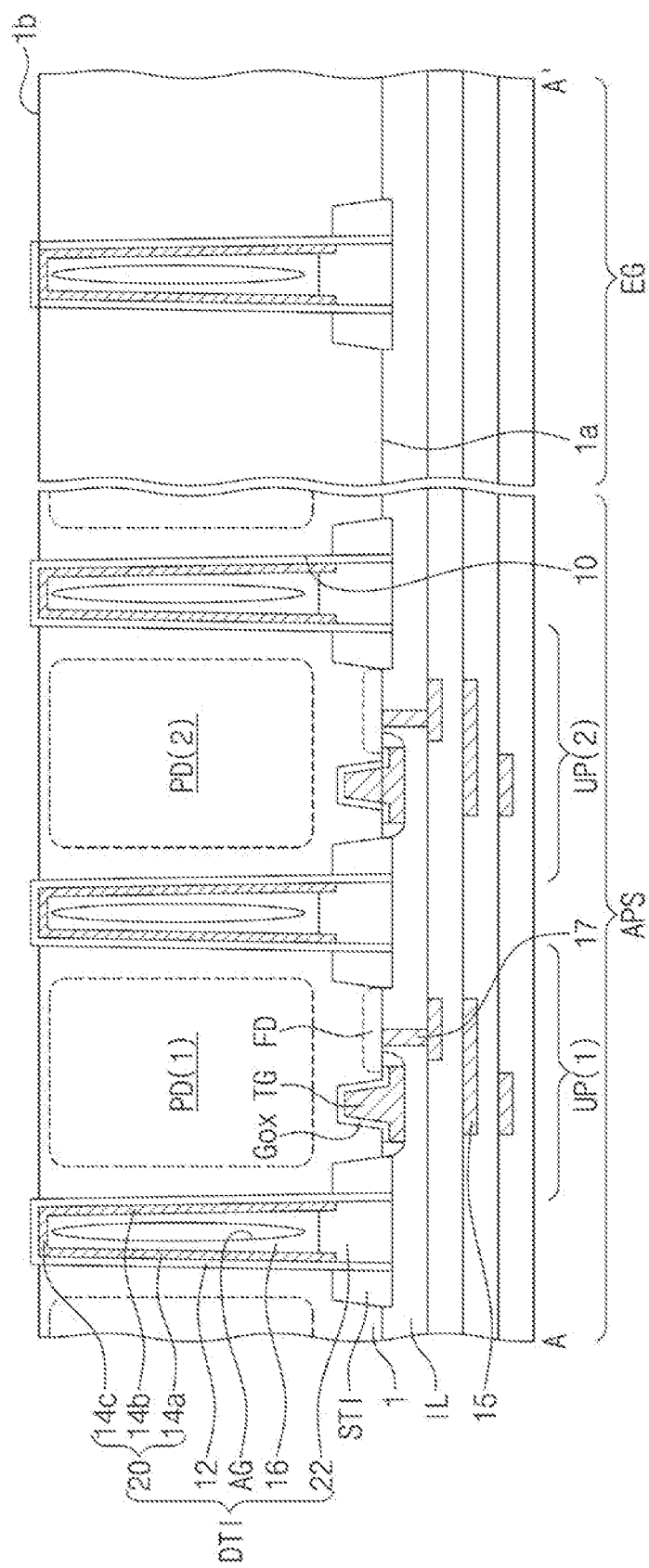
Figure 11C:
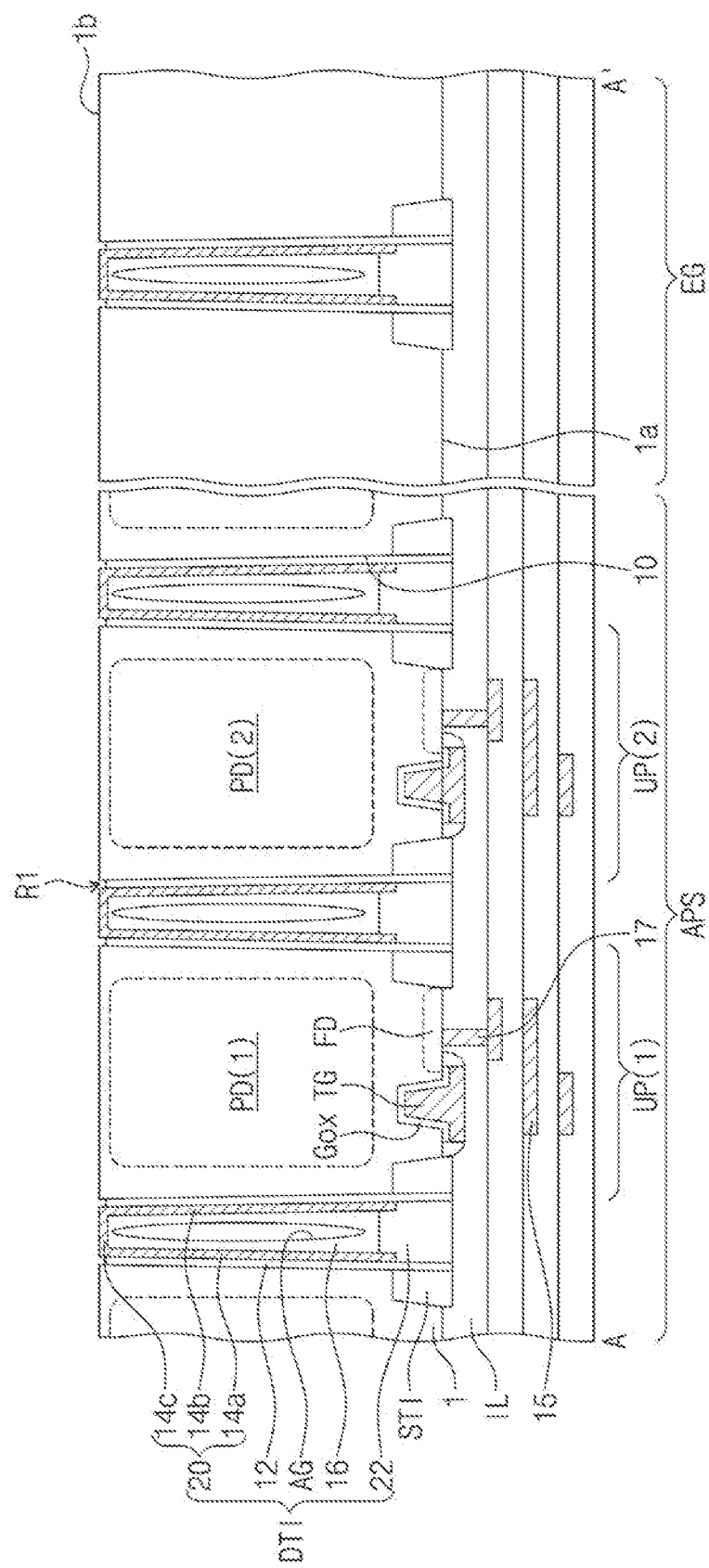

Referring to FIGS. 11B and 11C, a back grinding process may be performed on a portion of the first substrate 1 adjacent to the second surface 1b to expose the insulating liner 12. A wet isotropic etching process may be performed to remove the exposed insulating liner 12 and to expose a top surface and an upper sidewall of the connection conductive portion 14c and an upper sidewall of the first substrate 1. At this time, a top surface of the insulating liner 12 may be lowered from the second surface 1b, and thus a recess region R1 may be formed on the insulating liner 12.

Figure 11D:
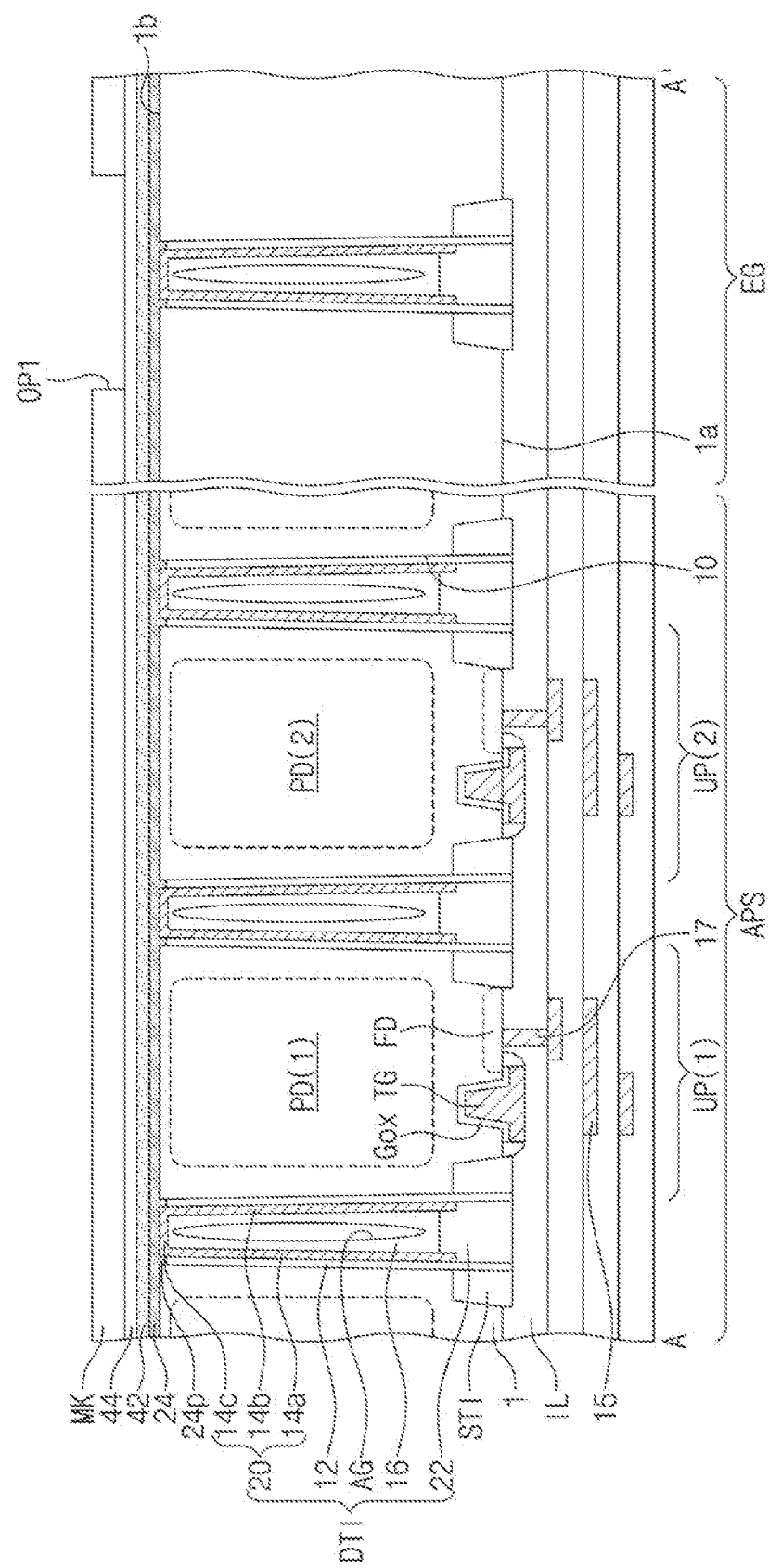

Referring to FIGS. 11C and 11D, a first fixed charge layer 24 may be formed on the second surface 1b. At this time, a portion 24p of the first fixed charge layer 24 may be inserted into the recess region R1. A second fixed charge layer 42 and a first protective layer 44 may be sequentially formed on the first fixed charge layer 24. A second mask pattern MK may be formed on the first protective layer 44. Subsequently, the processes described with reference to FIGS. 6J and 6K may be performed.

Figure 12:
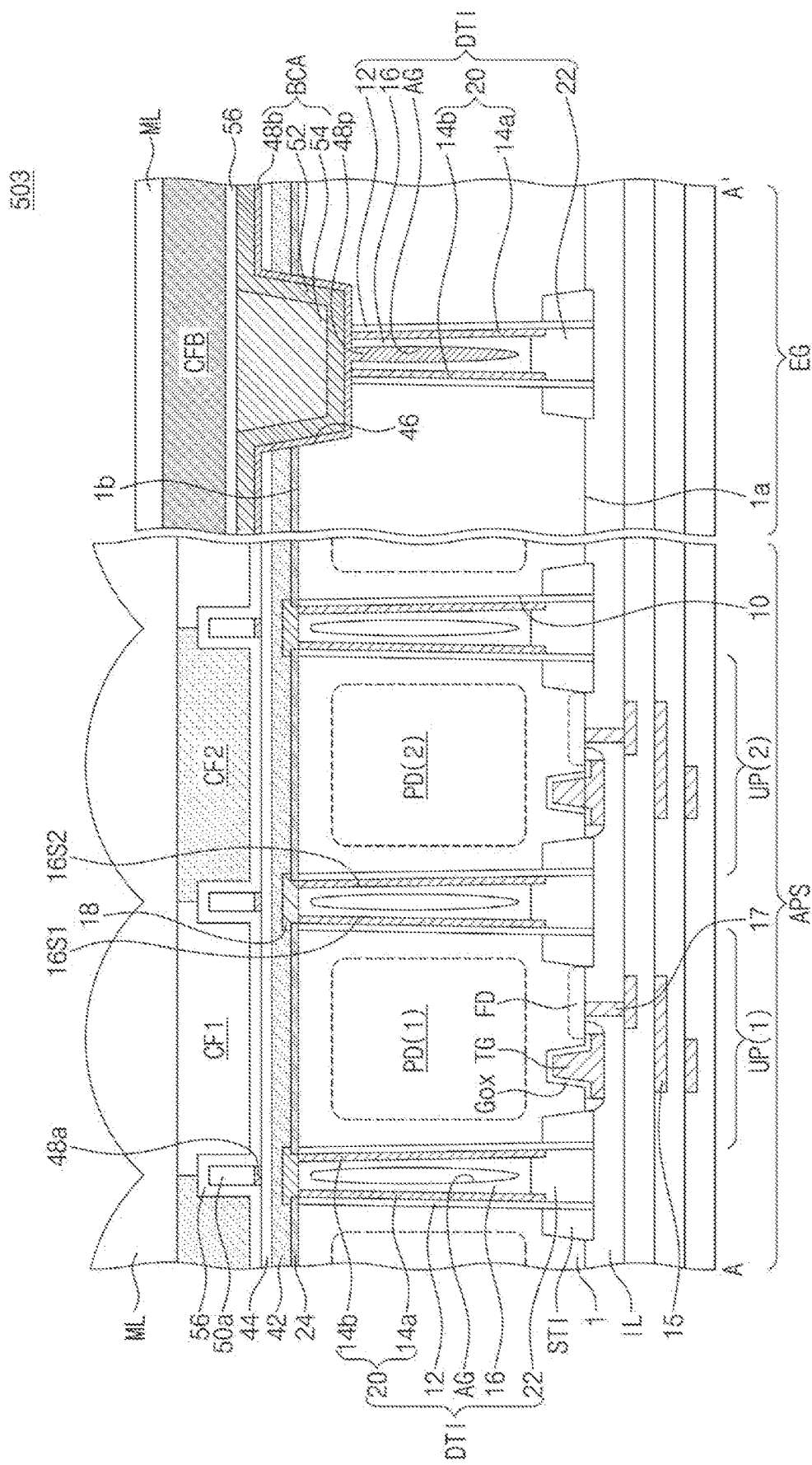
FIG. 12 is a cross-sectional view taken along the line A-A' of FIG. 3 according to some example embodiments of the disclosure.

FIG. 12 is a cross-sectional view taken along the line A-A' of FIG. 3 according to some embodiments of the disclosure.

Referring to FIG. 12, in an image sensor 503 according to some embodiments, a conductive structure 20 included in the pixel isolation portion DTI may include only a first conductive pattern 14a and a second conductive pattern 14b. The second surface 1b may be covered with a first fixed charge layer 24. A connection conductive pattern 18 may penetrate the first fixed charge layer 24 so as to be in contact with the first conductive pattern 14a and the second conductive pattern 14b. Other structures and/or components of the image sensor 503 according to some embodiments may be the same or similar to those described above.

Figure 13A:
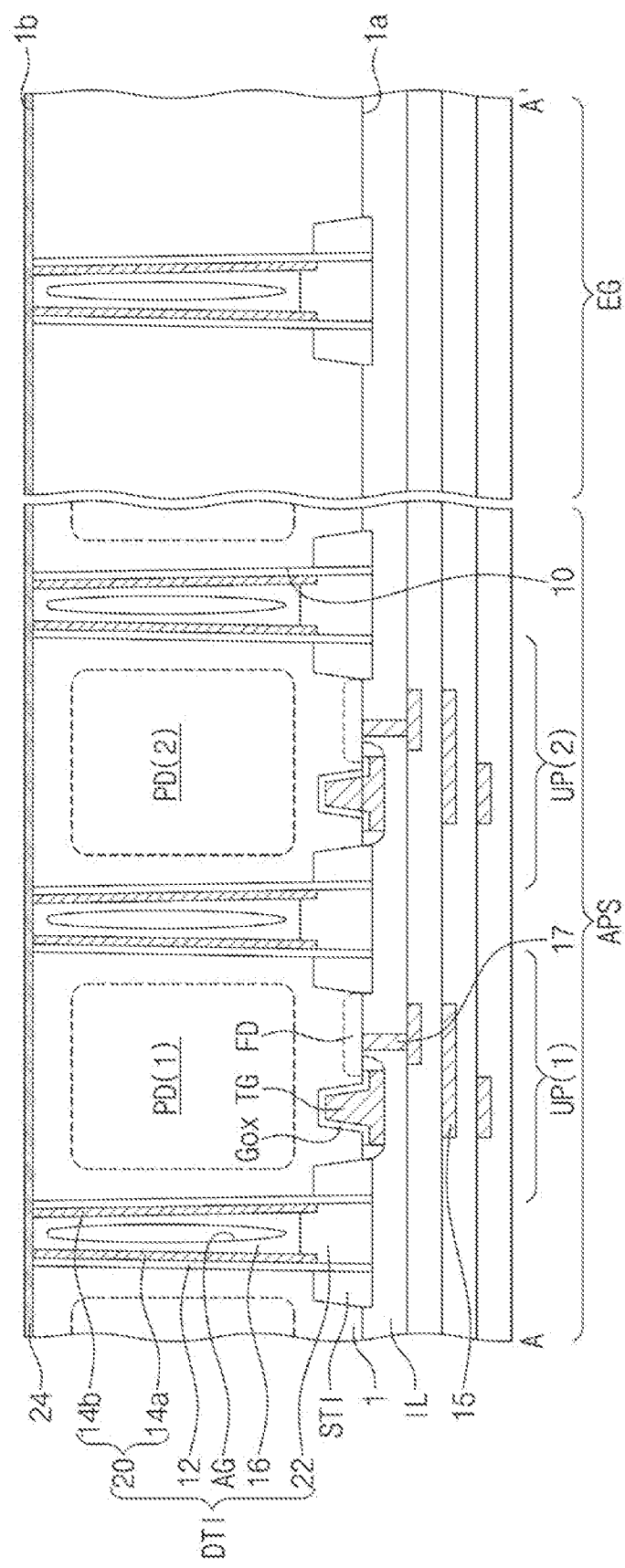
FIGS. 13A and 13B are cross-sectional views illustrating a method of manufacturing an image sensor of FIG. 12.
Figure 13B:
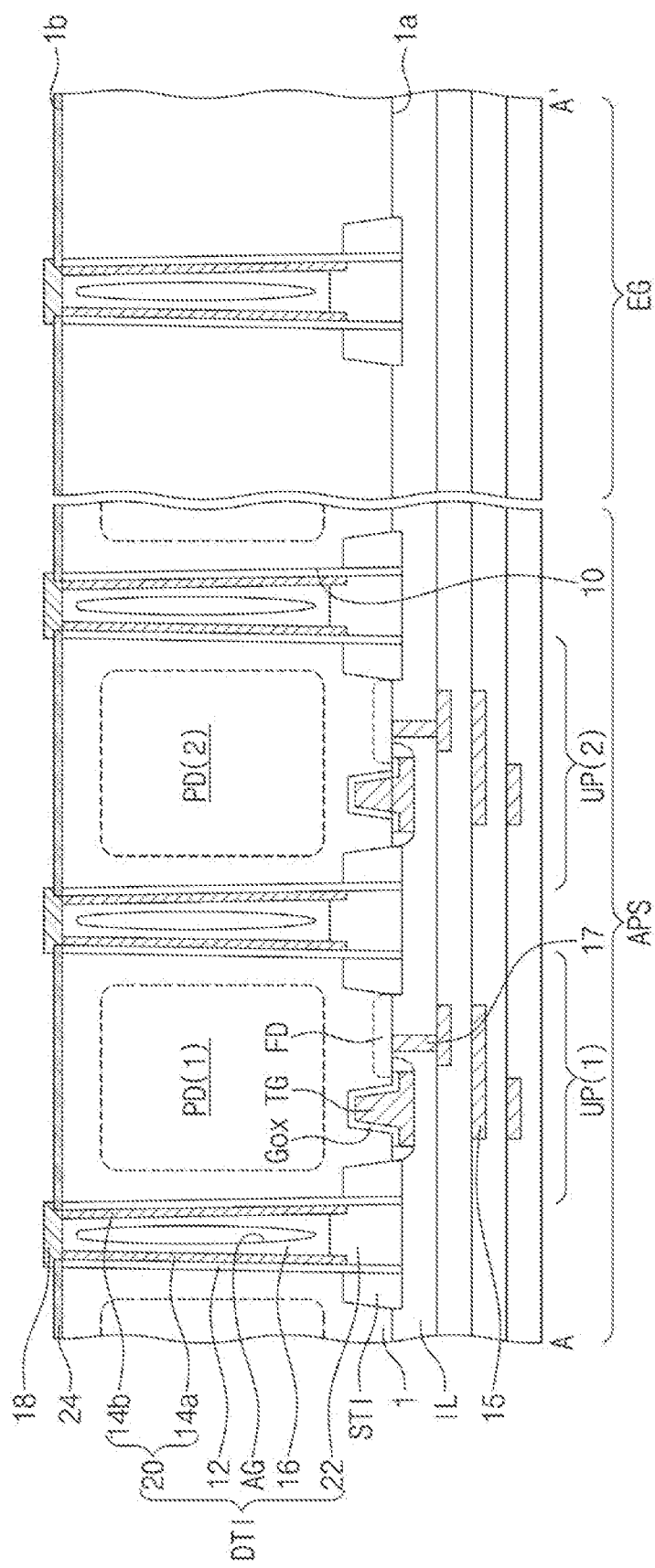

FIGS. 13A and 13B are cross-sectional views illustrating a method of manufacturing an image sensor of FIG. 12.

Referring to FIG. 13A, the processes described with reference to FIGS. 6E to 6G may be performed in the state of FIG. 11A, and then, a back grinding process may be performed on a portion of the first substrate 1 adjacent to the second surface 1b to expose the first filling insulation pattern 16. At this time, a portion of the insulating liner 12 and the connection conductive portion 14c of the conductive structure 20 may also be removed. However, the air gap region AG may not be exposed. Alternatively, the connection conductive portion 14c of the conductive structure 20 in the state of FIG. 11C may be removed to expose the first filling insulation pattern 16. Subsequently, a first fixed charge layer 24 may be formed on the second surface 1b.

Referring to FIG. 13B, the first fixed charge layer 24 may be etched to form a second opening OP2 exposing the first conductive pattern 14a and the second conductive pattern 14b of the conductive structure 20. The second opening OP2 may have a mesh shape overlapping the pixel isolation portion DTI when viewed in a plan view. A conductive layer may be deposited on the first fixed charge layer 24 and then may be etched to form a connection conductive pattern 18 which is in contact with the first and second conductive patterns 14a and 14b through the second opening OP2. The deposition process of the conductive layer for the formation of the connection conductive pattern 18 may be performed at a temperature of, for example, 400 degrees Celsius or less, and thus the interconnection lines 15 on the first surface 1a may not be damaged. In addition, the etching process may be performed on the conductive layer provided on the first fixed charge layer 24, and thus the first fixed charge layer 24 may protect the second surface 1b of the first substrate 1 from an etchant. As a result, the second surface 1b may not be damaged. Subsequently, the processes described with reference to FIGS. 6I to 6K may be performed.

Figure 14:
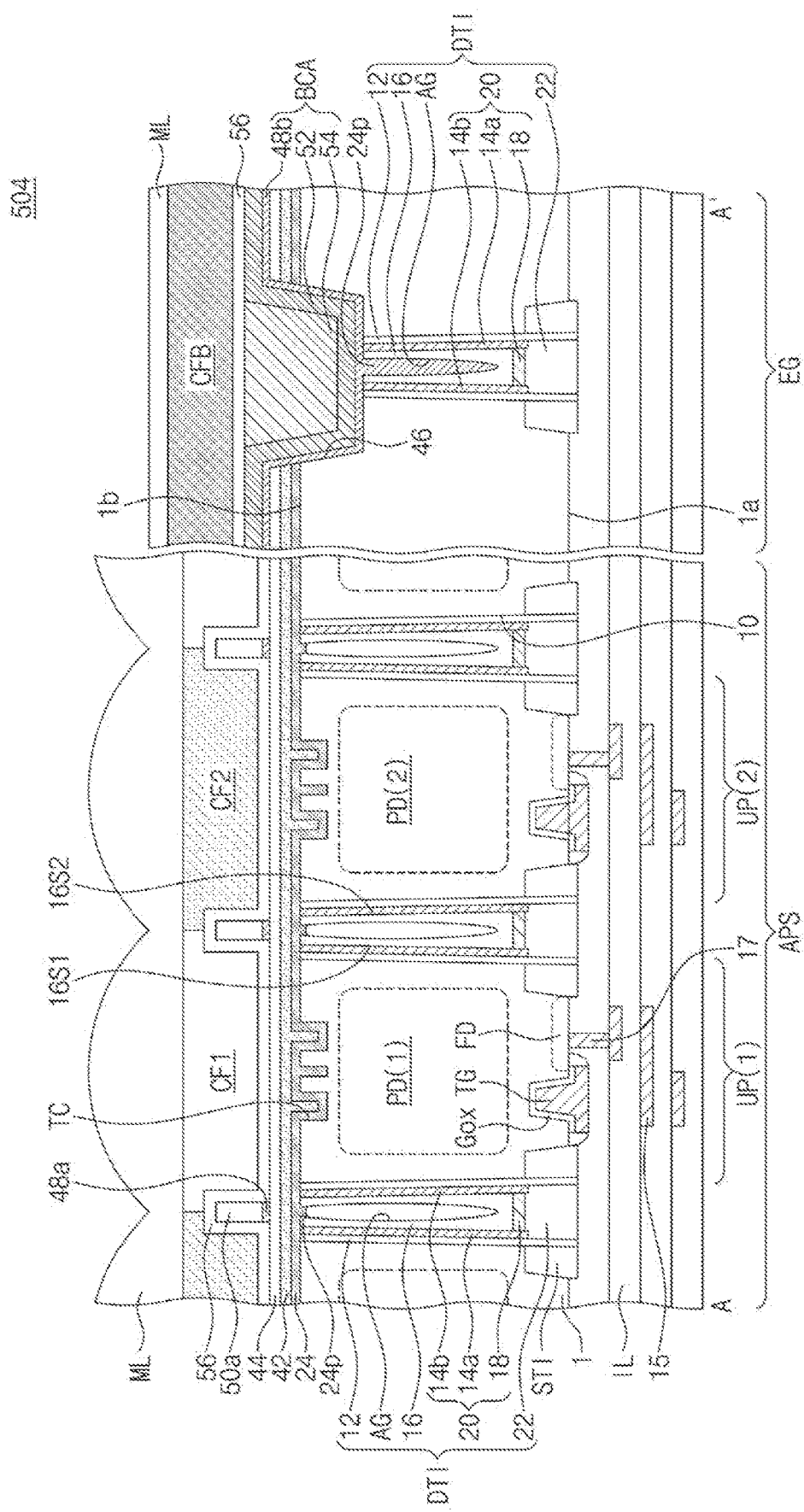
FIG. 14 is a cross-sectional view taken along the line A-A' of FIG. 3 according to some example embodiments of the disclosure.

FIG. 14 is a cross-sectional view taken along the line A-A' of FIG. 3 according to some embodiments of the disclosure.

Referring to FIG. 14, an image sensor 504 according to some embodiments may include at least one substrate trench TC formed in the second surface 1b of the first substrate 1. The substrate trench TC may have at least one of various shapes such as a polygonal shape (e.g., a triangular shape, a tetragonal shape, a pentagonal shape, etc.), a cross shape, and a star shape when viewed in a plan view. The substrate trench TC may be formed at a position at which incident light is focused by the lens portion of the micro lens array layer ML. The first fixed charge layer 24 may be partially inserted into the substrate trench TC to conformally cover an inner sidewall and a bottom surface of the substrate trench TC. When the substrate trench TC has a relatively narrow width, the substrate trench TC may be filled with the first fixed charge layer 24. A portion of the second fixed charge layer 42 may also be inserted into the substrate trench TC.

The substrate trench TC may function as a light splitter for scattering incident light provided to the second surface 1b. Thus, the incident light may be scattered in the first substrate 1 to cause multiple reflections and to increase a light path. Therefore, a quantum efficiency may be increased or improved. As a result, a sensing sensitivity of light having a relatively long wavelength (e.g., infrared light or red light) may be improved. The image sensor 504 may be referred to as an infrared sensor. Other structures and/or components of the image sensor 504 according to some embodiments may be the same or similar to those described above.

Figure 15:
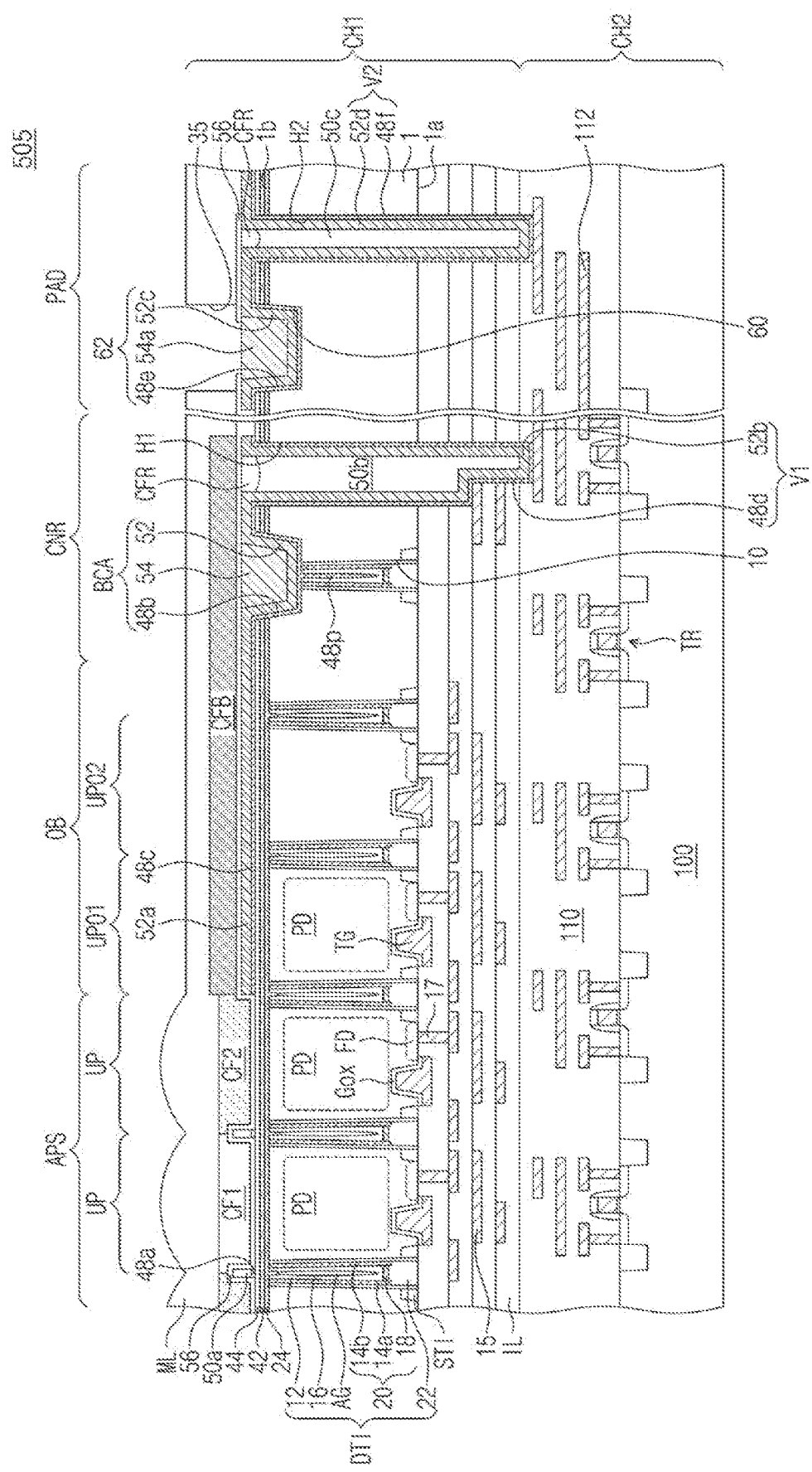
FIG. 15 is a cross-sectional view illustrating an image sensor according to some example embodiments of the disclosure.

FIG. 15 is a cross-sectional view illustrating an image sensor according to some embodiments of the disclosure.

Referring to FIG. 15, an image sensor 505 according to some embodiments may have a structure in which a first sub-chip CH1 and a second sub-chip CH2 are bonded to each other. For example, the first sub-chip CH1 may perform an image sensing function. For example, the second sub-chip CH2 may include circuits for driving the first sub-chip CH1 and/or for storing electrical signals generated from the first sub-chip CH1.

The second sub-chip CH2 may include a second substrate 100, a plurality of transistors TR disposed on the second substrate 100, a second interlayer insulating layer 110 covering the second substrate 100, and second interconnection lines 112 disposed in the second interlayer insulating layer 110. The second interlayer insulating layer 110 may have a single-layered or multi-layered structure including at least one of a silicon oxide layer, a silicon nitride layer, a silicon oxynitride layer, or a porous insulating layer. The first sub-chip CH1 and the second sub-chip CH2 may be bonded to each other. Thus, a first interlayer insulating layer IL of the first sub-chip CH1 may be in contact with the second interlayer insulating layer 110.

The first sub-chip CH1 may include a first substrate 1 including a pad region PAD, a connection region CNR, an optical black region OB, and a pixel array region APS. The first sub-chip CH1 in the pixel array region APS and a portion of the connection region CNR may have the same structure as described with reference to FIGS. 3 and 4. In other words, the pixel array region APS may include a plurality of unit pixels UP. In the pixel array region APS, a pixel isolation portion DTI may be disposed in the first substrate 1 to isolate the unit pixels UP from each other. A shallow device isolation portion STI may be disposed adjacent to the first surface 1a in the first substrate 1. The pixel isolation portion DTI may penetrate the shallow device isolation portion STI. A photoelectric conversion portion PD may be disposed in the first substrate 1 in each of the unit pixels UP. A transfer gate TG may be disposed on the first surface 1a of the first substrate 1 of each of the unit pixels UP. A floating diffusion region FD may be disposed in the first substrate 1 at a side of the transfer gate TG. The first surface 1a may be covered with first interlayer insulating layers IL.

The pixel isolation portion DTI may include the insulating liner 12, the first filling insulation pattern 16, the conductive structure 20, the second filling insulation pattern 22 and the air gap region AG, described with reference to FIGS. 3 to 5D. The structure of the pixel isolation portion DTI is not limited to the structures of FIGS. 3 to 5D. In some embodiments, the pixel isolation portion DTI may have one of the structures described with reference to FIGS. 7 to 8B, 10 and 12.

Light may not be incident into the first substrate 1 of the optical black region OB. The pixel isolation portion DTI may extend into the optical black region OB to isolate a first black pixel UPO1 and a second black pixel UPO2 from each other. The photoelectric conversion portion PD may be disposed in the first substrate 1 of the first black pixel UPO1. The photoelectric conversion portion PD may not exist in the first substrate 1 of the second black pixel UPO2. A transfer gate TG and a floating diffusion region FD may be disposed in each of the first and second black pixels UPO1 and UPO2. The first black pixel UPO1 may sense the amount of charges generated from the photoelectric conversion portion PD into which light is not incident, and thus the first black pixel UPO1 may provide a first reference charge amount. The first reference charge amount may be used as a relative reference value when the amounts of charges generated from the unit pixels UP are calculated. The second black pixel UPO2 may sense the amount of charges generated in a state in which the photoelectric conversion portion PD does not exist, and thus the second black pixel UPO2 may provide a second reference charge amount. The second reference charge amount may be used as data for removing process noise.

The first fixed charge layer 24, the second fixed charge layer 42, the first protective layer 44 and the second protective layer 56 may extend onto the second surface 1b of the optical black region OB, the connection region CNR and the pad region PAD. The edge region EG described with reference to FIGS. 3 to 5D, 7 to 8B, 10 and 12 may correspond to a portion of the connection region CNR of FIG. 15.

Referring to FIGS. 4 and 15, in the connection region CNR, a connection contact BCA may penetrate the first protective layer 44, the second fixed charge layer 42, the first fixed charge layer 24 and a portion of the first substrate 1 so as to be in contact with the first conductive pattern 14a and the second conductive pattern 14b of the pixel isolation portion DTI. The connection contact BCA may be disposed in a first trench 46. The connection contact BCA may include a first diffusion barrier pattern 48b conformally covering an inner sidewall and a bottom surface of the first trench 46, a first metal pattern 52 on the first diffusion barrier pattern 48b, and a second metal pattern 54 filling the first trench 46. A protrusion 48p of the first diffusion barrier pattern 48b may be inserted into the air gap region AG.

A portion of the first diffusion barrier pattern 48b may extend onto the first protective layer 44 of the optical black region OB to provide a first optical black pattern 48c. A portion of the first metal pattern 52 may extend onto the first optical black pattern 48c of the optical black region OB to provide a second optical black pattern 52a. The second protective layer 56 may cover the second optical black pattern 52a and the connection contact BCA. A third optical black pattern CFB may be disposed on the second protective layer 56 of the optical black region OB and the connection region CNR.

In the connection region CNR, a first via V1 may be disposed at a side of the connection contact BCA. The first via V1 may be referred to as a back bias stack via. The first via V1 may penetrate the first protective layer 44, the second fixed charge layer 42, the first fixed charge layer 24, the first substrate 1, the first interlayer insulating layers IL and a portion of the second interlayer insulating layer 110 so as to be in contact with at least one of the first interconnection lines 15 and at least one of the second interconnection lines 112.

The first via V1 may be disposed in a first via hole H1. The first via V1 may include a second diffusion barrier pattern 48d and a first via pattern 52b on the second diffusion barrier pattern 48d. The second diffusion barrier pattern 48d may be connected to the first diffusion barrier pattern 48b. The first via pattern 52b may be connected to the first metal pattern 52. The connection contact BCA may be connected to at least one of the first interconnection lines 15 and at least one of the second interconnection lines 112 through the first via V1.

Each of the second diffusion barrier pattern 48d and the first via pattern 52b may conformally cover an inner surface of the first via hole H1. The second diffusion barrier pattern 48d and the first via pattern 52b may not completely fill the first via hole H1. A first low-refractive index residual layer 50b may fill the first via hole H1. A color filter residual layer CFR may be disposed on the first low-refractive index residual layer 50b.

An external connection pad 62 and a second via V2 which are connected to each other may be disposed in the pad region PAD. The external connection pad 62 may penetrate the first protective layer 44, the second fixed charge layer 42, the first fixed charge layer 24, and a portion of the first substrate 1. The external connection pad 62 may be disposed in a second trench 60. The external connection pad 62 may include a third diffusion barrier pattern 48e and a first pad pattern 52c which sequentially and conformally cover an inner sidewall and a bottom surface of the second trench 60, and a second pad pattern 54a filling the second trench 60.

The second via V2 may penetrate the first protective layer 44, the second fixed charge layer 42, the first fixed charge layer 24, the first substrate 1, the first interlayer insulating layers IL and a portion of the second interlayer insulating layer 110 so as to be in contact with at least one of the second interconnection lines 112. The external connection pad 62 may be connected to at least one of the second interconnection lines 112 through the second via V2. The second via V2 may be disposed in a second via hole H2. The second via V2 may include a fourth diffusion barrier pattern 48f and a second via pattern 52d which sequentially and conformally cover an inner sidewall and a bottom surface of the second via hole H2. The fourth diffusion barrier pattern 48f and the second via pattern 52d may not completely fill the second via hole H2. A second low-refractive index residual layer 50c may fill the second via hole H2. A color filter residual layer CFR may be disposed on the second low-refractive index residual layer 50c.

The light blocking pattern 48a, the first diffusion barrier pattern 48b, the first optical black pattern 48c and the second to fourth diffusion barrier patterns 48d to 48f may have the same thickness and the same material (e.g., titanium). The first metal pattern 52, the second optical black pattern 52a, the first via pattern 52b, the first pad pattern 52c and the second via pattern 52d may have the same thickness and the same material (e.g., tungsten). The second metal pattern 54 and the second pad pattern 54a may have the same material (e.g., aluminum).

The low-refractive index pattern 50a, the first low-refractive index residual layer 50b and the second low-refractive index residual layer 50c may have the same material. The color filter residual layer CFR may have the same color and material as one of the color filters CF1 and CF2.

The second protective layer 56 may extend into the pad region PAD and may have an opening exposing the second pad pattern 54a. The micro lens array layer ML may extend into the optical black region OB, the connection region CNR and the pad region PAD. The micro lens array layer ML may have an opening 35 exposing the second pad pattern 54a in the pad region PAD.

Figure 16:
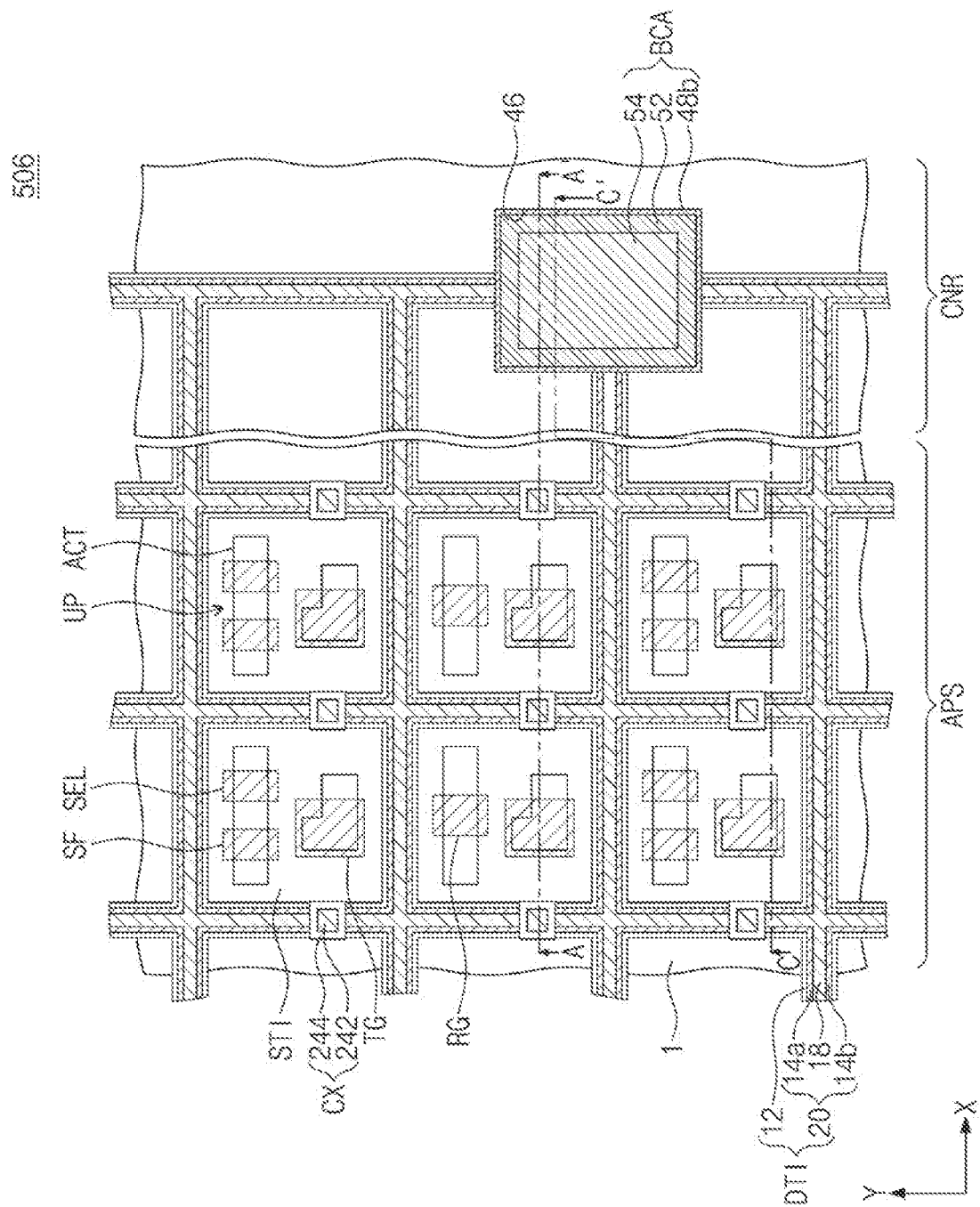
FIG. 16 is a plan view illustrating an image sensor according to some example embodiments of the disclosure.
Figure 17:
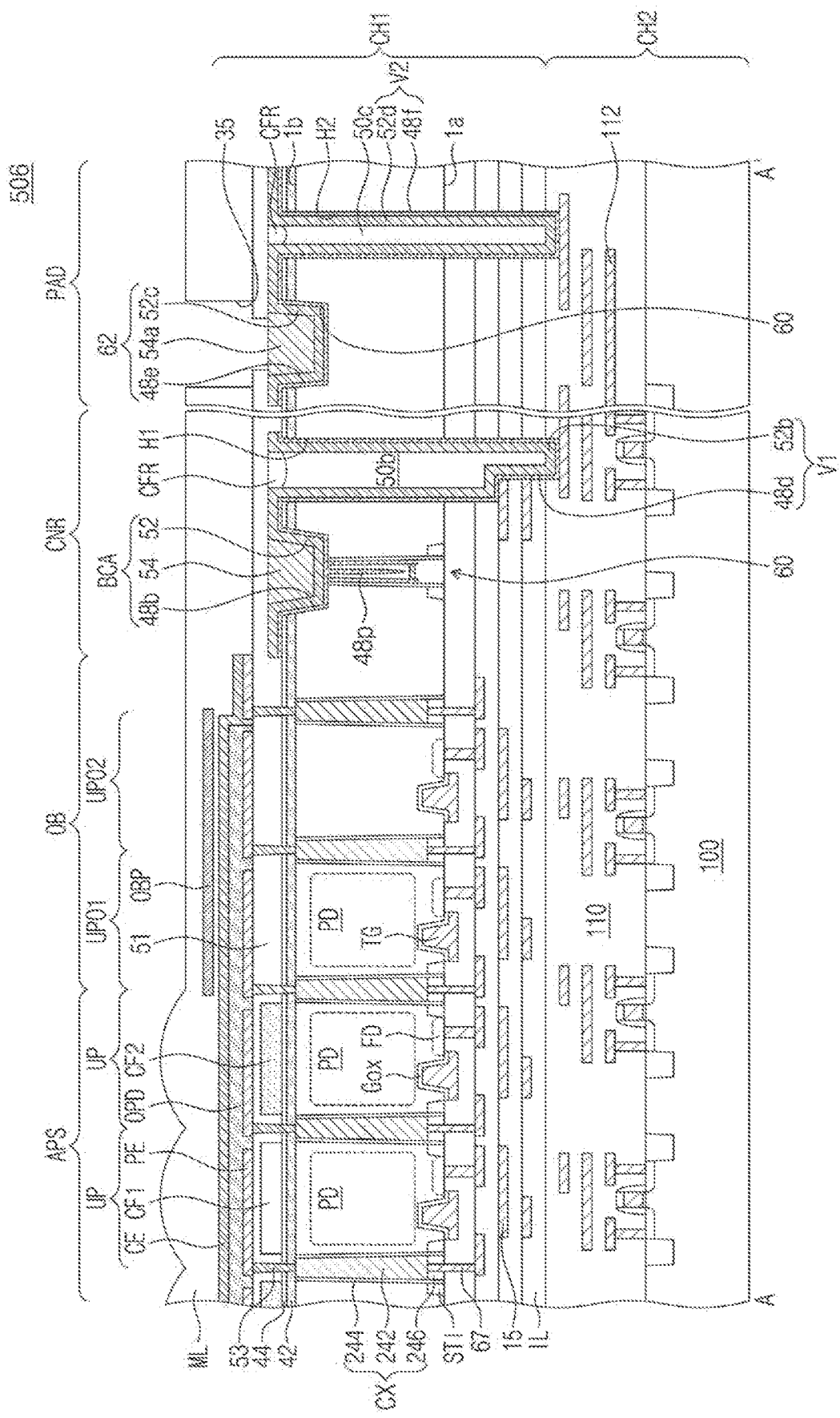
FIG. 17 is a cross-sectional view taken along a line A-A' of FIG. 16.

FIG. 16 is a plan view illustrating an image sensor according to some embodiments of the disclosure. FIG. 17 is a cross-sectional view taken along a line A-A' of FIG. 16. An optical black region, a pad region and a portion of a connection region are omitted in FIG. 16. A cross-sectional view taken along a line C-C' of FIG. 16 may include the pixel isolation portion DTI of FIG. 4, instead of a through-contact structure CX of FIG. 17. The cross-sectional view taken along the line C-C' of FIG. 16 may be the same or similar to those as FIG. 4.

Referring to FIGS. 4, 16 and 17, an image sensor 506 according to some embodiments may be an example of an organic CMOS image sensor. In the plan view of FIG. 16, a through-contact structure CX penetrating the pixel isolation portion DTI may be disposed at a side of each of the unit pixels UP. The through-contact structure CX may include a contact pattern 242 extending from the first surface 1a toward the second surface 1b, a contact insulating layer 244 surrounding the contact pattern 242, and a third filling insulation pattern 246 between the contact pattern 242 and a first interlayer insulating layer IL, which is closest to the first surface 1 a among the first interlayer insulating layers IL. The contact pattern 242 may include a conductive material. The contact pattern 242 may be insulated from the conductive structure 20 of the pixel isolation portion DTI.

A second contact plug 67 may penetrate the first interlayer insulating layer IL closest to the first surface 1a and the third filling insulation pattern 246 so as to be in contact with the contact pattern 242. The second contact plug 67 may be connected to one of the first interconnection lines 15. Each of the color filters CF1 and CF2 may correspond to a blue color or a red color. A planarization layer 51 may cover the color filters CF1 and CF2. For example, the planarization layer 51 may include silicon oxide and/or plasma-enhanced tetraethylorthosilicate (PETEOS). In the pixel array region APS and the optical black region OB, pixel electrodes PE may be disposed on the planarization layer 51 and may be spaced apart from each other. The pixel electrodes PE may overlap the unit and black pixels UP, UPO1 and UPO2, respectively. A third contact plug 53 may penetrate the planarization layer 51 and may electrically connect the pixel electrode PE to the through-contact structure CX.

The pixel electrodes PE may be covered with an organic photoelectric conversion layer OPD. The organic photoelectric conversion layer OPD may include a P-type organic semiconductor material and an N-type organic semiconductor material, which form a PN junction. Alternatively, the organic photoelectric conversion layer OPD may include quantum dots or a chalcogenide. The organic photoelectric conversion layer OPD may perform photoelectric conversion of light having a specific color (e.g., a green color). A common electrode CE may be disposed on the organic photoelectric conversion layer OPD. The pixel electrodes PE and the common electrode CE may include indium tin oxide (ITO), indium zinc oxide (IZO), zinc oxide (ZnO), and/or an organic transparent conductive material.

A micro lens array layer ML may be disposed on the common electrode CE. An optical black pattern OBP may be disposed in the micro lens array layer ML in the optical black region OB. The optical black pattern OBP may include, for example, an opaque metal (e.g., aluminum). Other components may be the same or similar to those described with reference to FIGS. 4 and 15. The image sensor 506 according to some embodiments may include the organic photoelectric conversion layer OPD, and thus each of the unit pixels UP may sense two colors of light at the same time.

The pixel isolation portion of the image sensor according to the disclosure may include the insulating liner, the conductive structure, the first filling insulation pattern, and the air gap region. Thus, the crosstalk may be prevented, and the MTF characteristics may be improved to increase the photosensitivity. In addition, the dark current may be reduced or minimized, a crack of the substrate may be prevented, and the durability of the image sensor may be improved.

Descriptions of features or aspects within each example embodiment should typically be considered as available for other similar features or aspects in other example embodiments. For example, one of ordinary skill in the art to which the inventive concept pertains would understand that the configuration of an image sensor described with reference to FIGS. 3 to 17 may be changed in various ways, and one or more features described in the embodiments of FIGS. 3 to 17 may be combined or replaced with each other.

In the method of manufacturing the image sensor according to the embodiments of the disclosure, the image sensor having the pixel isolation portion capable of improving the MTF characteristics and of reducing or minimizing the dark current may be stably manufactured without a process defect, and a yield may be improved.

While the disclosure have been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scopes of the disclosure are to be determined by the broadest permissible interpretation of the following claims and their equivalents, and shall not be restricted or limited by the foregoing description.

What is claimed is:

1. An image sensor comprising:
    a substrate having a first surface and a second surface which is opposite to the first surface; and
    a pixel isolation portion provided in the substrate, the pixel isolation portion being configured to isolate unit pixels from each other,
    wherein the pixel isolation portion comprises:
    a first filling insulation pattern extending from the first surface toward the second surface and having an air gap region, the first filling insulation pattern including a first sidewall and a second sidewall which is opposite to the first sidewall;
    a conductive structure including a first portion on the first sidewall, a second portion on the second sidewall, and a connection portion connecting the first portion and the second portion; and
    an insulating liner provided between the first portion of the conductive structure and the substrate and provided between the second portion of the conductive structure and the substrate;
    wherein the image sensor further comprises a fixed charge layer covering the second surface, and
    wherein a portion of the fixed charge layer protrudes towards the air gap region.

2. The image sensor of claim 1, wherein each of the insulating liner and the first filling insulation pattern includes silicon oxide, and
    wherein a density of the silicon oxide included in the insulating liner is greater than a density of the silicon oxide included in the first filling insulation pattern.

3. The image sensor of claim 1,
    wherein the portion of the fixed charge layer that extends into the air gap region closes an entrance of the air gap region.

4. The image sensor of claim 1, wherein an inner sidewall of at least one of the first portion or the second portion is exposed by the air gap region.

5. The image sensor of claim 1, wherein the substrate further includes an edge region spaced apart from the unit pixels, and
    wherein the pixel isolation portion extends into the edge region,
    the image sensor further comprising:
    a connection contact penetrating the fixed charge layer to be in contact with the conductive structure, in the edge region.

6. The image sensor of claim 5, wherein in the edge region, a portion of the connection contact extends into the air gap region to fill the air gap region.

7. The image sensor of claim 1, wherein the pixel isolation portion further comprises: a second filling insulation pattern, which is adjacent to the first surface and overlaps the first filling insulation pattern, and wherein the connection portion is provided between the first filling insulation pattern and the second filling insulation pattern.

8. The image sensor of claim 1, wherein at least one trench is formed in the second surface, corresponding to at least one unit pixel of the unit pixels.

9. The image sensor of claim 1,
wherein the connection portion is provided between the first filling insulation pattern and the fixed charge layer.

10. The image sensor of claim 9, wherein the fixed charge layer includes a protrusion protruding toward the insulating liner.

11. An image sensor comprising:
a substrate including unit pixels and including a first surface and a second surface which is opposite to the first surface;
a pixel isolation portion provided in the substrate to isolate the unit pixels from each other;
photoelectric conversion portions provided in the substrate, corresponding to the unit pixels, respectively;
a transfer gate provided on the first surface, corresponding to each unit pixel of the unit pixels;
a fixed charge layer contacting the second surface;
a color filter array provided on the fixed charge layer; and
a micro lens array layer on the color filter array,
wherein the pixel isolation portion comprises:
a first filling insulation pattern extending from the first surface toward the second surface and including an air gap region, the first filling insulation pattern including a first sidewall and a second sidewall which is opposite to the first sidewall; and
a conductive structure comprising: a first portion on the first sidewall; and a second portion on the second sidewall,
wherein a portion of the fixed charge layer protrudes toward the air gap region.

12. The image sensor of claim 11, wherein the portion of the fixed charge layer is configured to fill the air gap region.

13. The image sensor of claim 11, wherein the conductive structure further comprises: a connection conductive pattern connecting the first portion and the second portion, and
wherein the connection conductive pattern includes a different material from a material included in at least one of the first portion or the second portion.

14. The image sensor of claim 11, wherein the substrate further includes an edge region spaced apart from the unit pixels, wherein the pixel isolation portion extends into the edge region,
the image sensor further comprising:
a connection contact penetrating the fixed charge layer and contacting the conductive structure, in the edge region.

15. The image sensor of claim 14, wherein in the edge region, a portion of the connection contact extends into the air gap region to fill the air gap region.

16. An image sensor comprising:
a substrate including a first surface and a second surface which is opposite to the first surface; and
a pixel isolation portion provided in the substrate and configured to isolate a first unit pixel from a second unit pixel,
wherein the pixel isolation portion comprises:
a first filling insulation pattern extending from the first surface toward the second surface and including an air gap region, the first filling insulation pattern including a first sidewall and a second sidewall which is opposite to the first sidewall;
a conductive structure including a first portion on the first sidewall; a second portion on the second sidewall; and a connection portion connecting the first portion and the second portion; and
an insulating liner provided between the first portion and the substrate and provided between the second portion and the substrate,
wherein the image sensor further comprises a fixed charge layer covering the second surface,
wherein a portion of the fixed charge layer protrudes toward the air gap region, and
wherein a density of an insulating material included in the insulating liner is greater than a density of an insulating material included in the first filling insulation pattern.

17. The image sensor of claim 16, wherein the first portion surrounds the first unit pixel,
wherein the second portion surrounds the second unit pixel, and
wherein the connection portion has a mesh shape when viewed in a plan view.

18. The image sensor of claim 16,
wherein the fixed charge layer includes a protrusion protruding toward the air gap region.

19. The image sensor of claim 16, wherein an inner sidewall of at least one of the first portion or the second portion is exposed by the air gap region.

* * * * *